United States Patent
Hirano et al.

[11] Patent Number: 5,523,974
[45] Date of Patent: Jun. 4, 1996

[54] SEMICONDUCTOR MEMORY DEVICE WITH REDUNDANT MEMORY CELL BACKUP

[75] Inventors: Hiroshige Hirano; George Nakane, both of Nara; Tetsuji Nakakuma, Takatsuki; Nobuyuki Moriwaki, Kyoto; Toshio Mukunoki, Takatsuki; Tatsumi Sumi, Mishima, all of Japan

[73] Assignee: Matsushita Electric Industrial Co., Ltd., Osaka, Japan

[21] Appl. No.: 344,680

[22] Filed: Nov. 21, 1994

[30] Foreign Application Priority Data

Apr. 25, 1994 [JP] Japan .................................. 6-086685

[51] Int. Cl.⁶ ...................................................... G11C 7/00
[52] U.S. Cl. ...................... 365/200; 365/189.07; 365/210
[58] Field of Search .................................. 365/200, 210, 365/189.05, 189.07; 371/10.1, 10.2, 10.3

[56] References Cited

U.S. PATENT DOCUMENTS

| | | | |
|---|---|---|---|
| 4,757,474 | 7/1988 | Fukushi et al. | 365/200 X |
| 4,783,781 | 11/1988 | Awaga | 365/200 X |
| 5,128,944 | 7/1992 | Flaherty et al. | 365/200 X |
| 5,357,458 | 10/1994 | Yu et al. | 365/49 |
| 5,381,370 | 1/1995 | Lacey et al. | 365/200 |

FOREIGN PATENT DOCUMENTS 0178948  4/1986  European Pat. Off. ............... 365/200

*Primary Examiner*—David C. Nelms
*Assistant Examiner*—Son Dinh
*Attorney, Agent, or Firm*—Willian Brinks Hofer Gilson & Lione

[57] ABSTRACT

A semiconductor memory device comprises a main memory cell, a redundant memory cell, a redundant address data cell comprising a non-volatile memory which electrically memorizes an address of a redundant memory cell which replaced a failed memory cell in the main memory cell, a control circuit 15 and a redundant memory cell selecting circuit 16. The redundant memory cell selecting circuit serves to hold first address data which has been read from the redundant address data cell, and to compare the first address data with second address data for a read or write operation which is input via the control circuit and thereby select the main memory cell or the redundant memory cell.

15 Claims, 19 Drawing Sheets

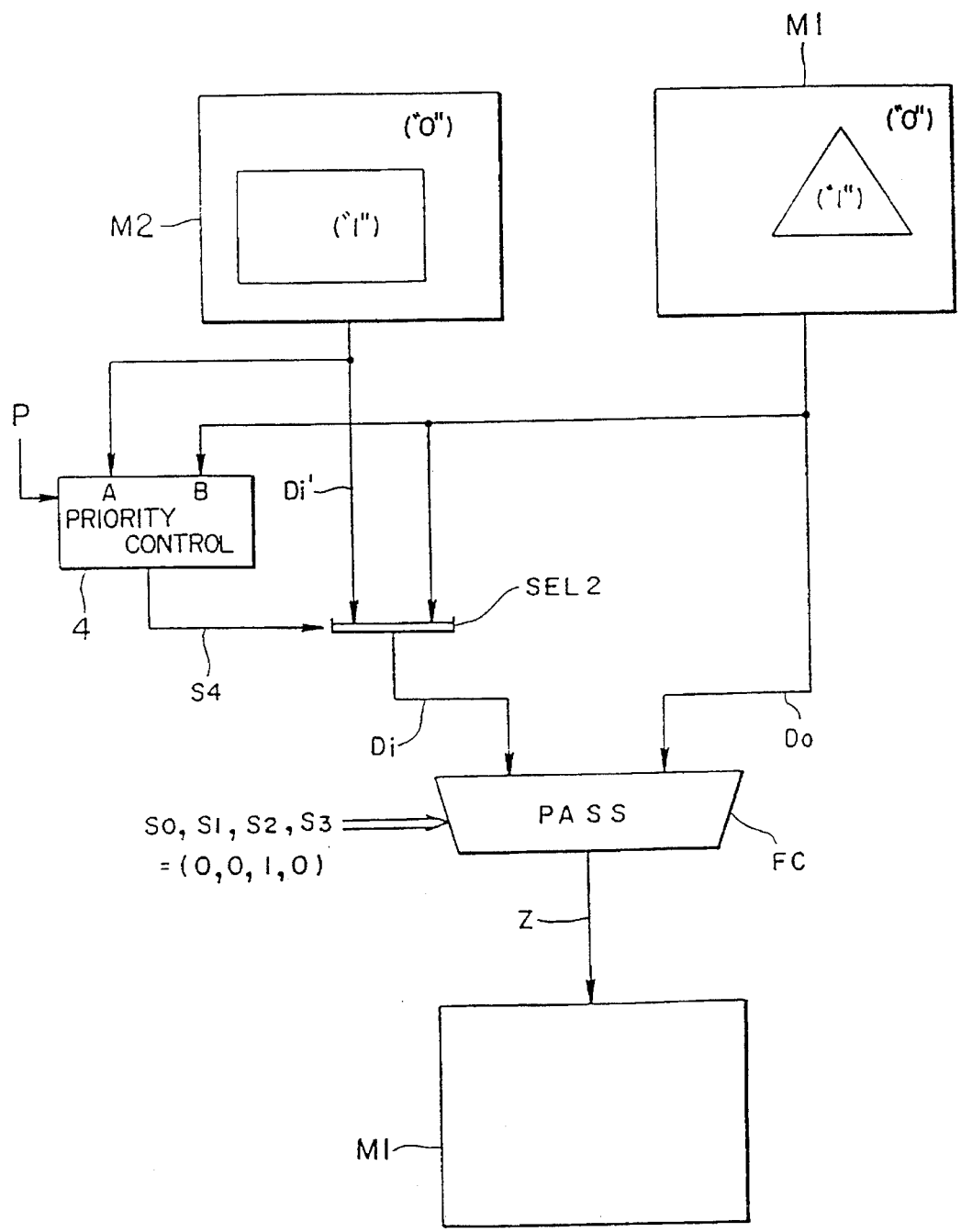

| P | Di'(A) | (B) | S4 | Di |
|---|---|---|---|---|
| 0 | 0 | 0 | 1 | M1 (BACKGROUND) |
|   | 0 | 1 | 1 | M1 |
|   | 1 | 0 | 0 | M2 |
|   | 1 | 1 | 0 | M2 |
| 1 | 0 | 0 | 1 | M1 (BACKGROUND) |
|   | 0 | 1 | 1 | M1 |
|   | 1 | 0 | 0 | M2 |
|   | 1 | 1 | 1 | M1 |

FIG. 20

| CNT | Cr | Y | Z |
|---|---|---|---|
| 0 | 0 | 0 | Do |
| 0 | 0 | 1 | $\overline{Do}$ |
| 0 | 1 | — | Y |
| 1 | — | — | Y PLUS Do PLUS Cr |

$$Z = \overline{(\overline{CNT} \cdot Cr)} \cdot Y + \overline{(\overline{CNT} \cdot Cr)} \cdot (Y \oplus Do \oplus Cr)$$

$$\overline{P} = \overline{Y \oplus Do + CNT}$$

$$\overline{G} = \overline{Y \cdot Do \cdot CNT}$$

FIG. 23b

| S₀ | S₁ | S₂ | S₃ | Z | |
|---|---|---|---|---|---|
| | | | | CNT = 0 | CNT = 1 |
| 0 | 0 | 0 | 0 | Do | Do |
| 0 | 0 | 1 | 0 | $\overline{Do}$ | Do MINUS 1 |
| 0 | 0 | 0 | 1 | Di ⊕ Do | DiPLUS Do |
| 0 | 0 | 1 | 1 | Di ⊕ Do | DoMINUS DIMINUS 1 |
| 1 | 0 | 0 | 0 | 0 | Do PLUS 1 |
| 1 | 0 | 1 | 0 | 1 | Do |
| 1 | 0 | 0 | 1 | Di | DiPLUS DoPLUS 1 |
| 1 | 0 | 1 | 1 | $\overline{Di}$ | Do MINUS DI |
| 0 | 1 | 0 | 0 | $\overline{Di}$ − Do | Do |
| 0 | 1 | 1 | 0 | Di + $\overline{Do}$ | Do MINUS 1 |
| 0 | 1 | 0 | 1 | Di + Do | DiPLUS Do |
| 0 | 1 | 1 | 1 | $\overline{Di \cdot Do}$ | DoMINUS DIMINUS 1 |
| 1 | 1 | 0 | 0 | Di · Do | Do PLUS 1 |
| 1 | 1 | 1 | 0 | $\overline{Di} + \overline{Do}$ | Do |
| 1 | 1 | 0 | 1 | Di · $\overline{Do}$ | DiPLUS DoPLUS 1 |
| 1 | 1 | 1 | 1 | $\overline{Di} + Do$ | Do minus Di |

SEMICONDUCTOR MEMORY DEVICE WITH REDUNDANT MEMORY CELL BACKUP

FIELD OF THE INVENTION

The present invention relates to a semiconductor memory device and its method of operation.

BACKGROUND OF THE INVENTION

Recently, as the capacity of semiconductor memory devices has increased, the density and integration of memory cells has also increased. In such a memory device, the failure of even a few memory cells leads to the failure of the memory device as a whole, thereby resulting in crucially lowered manufacturing yield. In order to overcome this situation, failed memory cells are replaced by redundant memory cells.

The structure of a prior art semiconductor memory device with redundant memory cells will be explained with reference to FIG. 21. The semiconductor memory device comprises, a main memory cell 1, a redundant memory cell 2 having redundant memory cells which will substitute for possibly failed memory cells in the main memory cell 1, a main decoder 3 for driving the memory cell part 1, a redundant decoder 4 for driving the redundant memory cell 2, a control circuit 5 for controlling the main decoder 3 and the redundant decoder 4, and an input terminal 6 for inputting an address signal and control signal.

In this semiconductor memory device, when an memory cell fails, its address data is stored in a non-volatile memory means (not shown) within the control circuit 5. Here the non-volatile memory means includes either a fuse-blowout memory or an electrically programmed and erasable memory (EPROM or EEPROM).

The read and write operations of this semiconductor memory device are conducted in the following manner:

First, a control signal and address data are input to the input terminals 6. When the address data coincides with data stored in the non-volatile memory means within the control circuit 5, a signal from the control circuit 5 puts the main decoder 3 into a disabled state, thereby preventing write or read operations with the main memory cell 1 and allowing write and read with the redundant memory cell 2.

When fuses are employed for the non-volatile memory means, it is a common practice to cut them by laser beam cutting, namely, an apparatus for generating laser light is needed. Using this process, the fuse is separated into two parts by laser beam cutting so that both sides of the fuse are disconnected. In this case, a complicated adjusting procedure is necessary which confirms the address data of a failed memory cell by means of a tester, controls the irradiating position of a laser light according to the address data, and adjusts the output energy of the laser light.

Although it is possible for a manufacturer to store the address data of failed memory cells found at the shipment test into the non-volatile memory means, it is practically impossible for users themselves to write in the address data of failed memory cells occurring during field operation.

On the other hand, when a memory dedicated for read-out only such as EPROM or EEPROM is employed, it may be possible for users to electrically write in the address data of failed memory cells. In this case, however, an additional manufacturing process step for the EEPROM is needed.

Furthermore, when employing a commonly used MONOS type EEPROM, write-in speed is slow although read-out speed is fast, and a high write-in voltage is needed.

This type of prior art semiconductor does not provide the important advantage of ability to replace failed memory cells at anytime without using any additional devices.

SUMMARY OF THE INVENTION

The present invention provides an semiconductor memory device and method of operation, wherein failed memory cells in the main memory cell are replaced by memory cells in the redundant memory cell at anytime whenever needed and their address are stored without using any additional device, and a redundant memory cell selecting circuit is operated at high speed.

A semiconductor memory device according to the present invention comprises, a main memory cell, a redundant memory cell, a redundant address data cell comprising a semiconductor memory which electrically stores addresses by which part of the main memory cell is replaced by redundant memory cells, a controlling circuit, and a redundant memory cell selecting circuit.

The redundant memory cell selecting circuit stores the first address data, and compares the first address data with the second address data input via the controlling circuit for read or write operation. Based on this comparison, the redundant memory cell selecting circuit then selects either the main memory cell or the redundant memory cell. The redundant memory cell selecting circuit preferably contains first latch circuits for storing the first address data read from the redundant address data cell.

In the operation of the semiconductor memory device according to the invention the first address data is read from the redundant memory cell and then held in the first latch circuit of the redundant memory cell selecting circuit during the first data read period after application of the voltage source.

According to this structure, upon application of the voltage source the first address data is read from the redundant address data cell and stored in the redundant address selecting circuit, thereby enabling high speed operation for selecting a redundant address.

In addition, since the redundant address data cell is made with the same semiconductor memory as the main memory cell, high integration can be realized.

Furthermore, provided that the memory cells in the redundant address data cell are made with, for example, a ferroelectric capacitor and a MOS transistor, it is possible at a given time to store an address of that part of the redundant memory cell which replaces failed memory cells in the main memory cell without using any special device or process.

The invention itself, together with further objects and attendant advantages, will best be understood by reference to the following description, taken in conjunction with the accompanying drawings.

DETAILED DESCRIPTION

Figure 1:
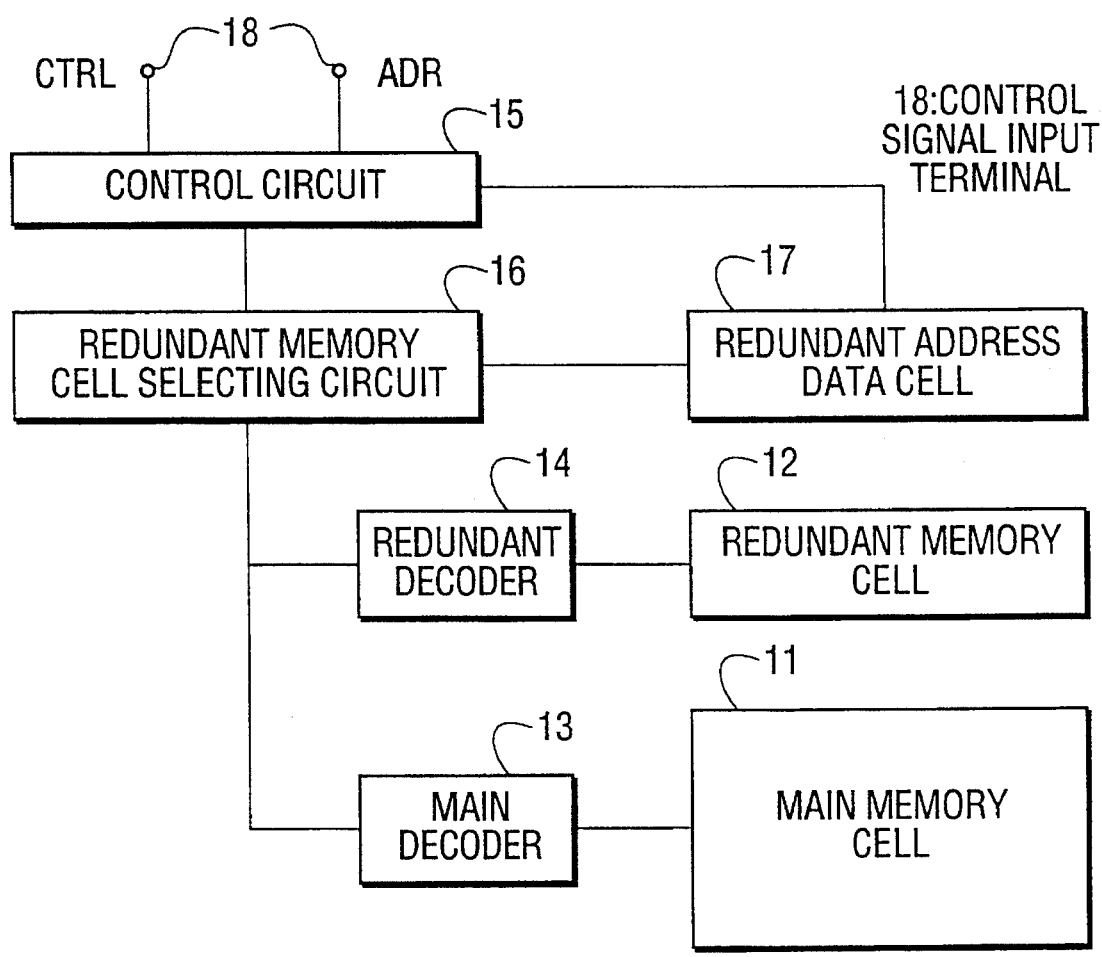
FIG. 1 is the circuit block diagram of a semiconductor memory device according to the first embodiment of this invention.

According to this invention, a semiconductor memory device, shown in FIG. 1, comprises: a main memory cell 11 for storing information; a redundant memory cell 12 for replacing failed memory cells in the main memory cell 11 whenever they happen to fail; a main decoder 13 for driving the main memory cell 11; a redundant decoder 14 for driving the main memory cell 12; a control circuit 15 for controlling the semiconductor memory device; a redundant memory cell selecting circuit 16 for selecting either the main memory cell 11 or the redundant memory cell 12; a redundant address data cell 17, which comprises a nonvolatile semiconductor memory for storing address data of a possibly failed memory cell in the main memory cell 11; and an input terminal 18 for receiving a control signal for controlling the semiconductor memory device and an address signal.

It is noted here that the redundant memory cell selecting circuit 16 serves, upon application of voltage source, to read address data (first address data) from the redundant address data cell 17 by means of which failed memory cells in the main memory cell 11 are replaced by memory cells in the redundant memory cell 12. The redundant memory selecting circuit 16 holds address data as long as the voltage source is applied.

In this semiconductor memory device, the read operation is conducted in the following manner:

First, by inputting a control signal to the input terminal 18 a read state is set. Next, address data (second address data) for a read operation is sent from the input terminal 18, through the control circuit 15, to the redundant memory cell selecting circuit 16, where the first address data which has been read from the redundant address data cell 17 and the second address data which has been input via the control circuit 15 are compared.

If the first and second address data are not the same, the redundant memory cell 12 is not selected and the main memory cell 11 is selected, and information data is read from the specified memory cell in the main memory cell 11.

On the other hand, if the first and second address data do coincide with each other, the main memory cell 11 is not selected and the redundant memory cell 12 is selected, and information is read from the specified memory cell in the redundant memory cell 12.

The write operation is conducted in the same way as the above mentioned read operation:

First, by inputting a control signal to the input terminal 18 a write state is set. Next, a second address data for a write operation is sent from the input terminal 18, through the control circuit 15, to the redundant memory cell selecting circuit 16, wherein the first address data which has been read from the redundant address data cell 17 and the second address data which has been input via the control circuit part 15 are compared.

If the first and second address data do not coincide with each other, the main memory cell 11 is selected, and information data is written into the specified memory cell in the main memory cell 11. On the other hand, if the first and second address data coincide with each other, the redundant memory cell 12 is selected, and information data is written into the specified memory cell in the redundant memory cell 12.

The key feature of this embodiment is that address data (a first address data), by means of which failed memory cells occurring in the main memory cell 11 are replaced by part of the redundant memory cell 12, is stored in the redundant address data cell 17 which comprises a non-volatile memory. Upon application of voltage, the first address data which has been read from the redundant address data cell 17 is stored in the redundant memory cell selecting circuit 16, and according to this first address data temporarily stored in the redundant memory cell selecting circuit 16, either the main memory cell 11 or the redundant memory cell 12 is selected.

Accordingly, in this embodiment of the semiconductor memory device the address data (a first address data) of the redundant memory cell 12 is stored without using a complicated device and can be operated without employing blowout fuses as in the case of a prior art semiconductor memory device.

Furthermore, during the operation, by comparing the address data (a first address data) of the redundant memory cell 12 which has been read to the redundant memory cell selecting circuit 16 and the address (a second address data) which has been input from the input terminal 18 it is possible to select at high speed either the main memory cell 11 or the redundant memory cell 12.

Figure 2:
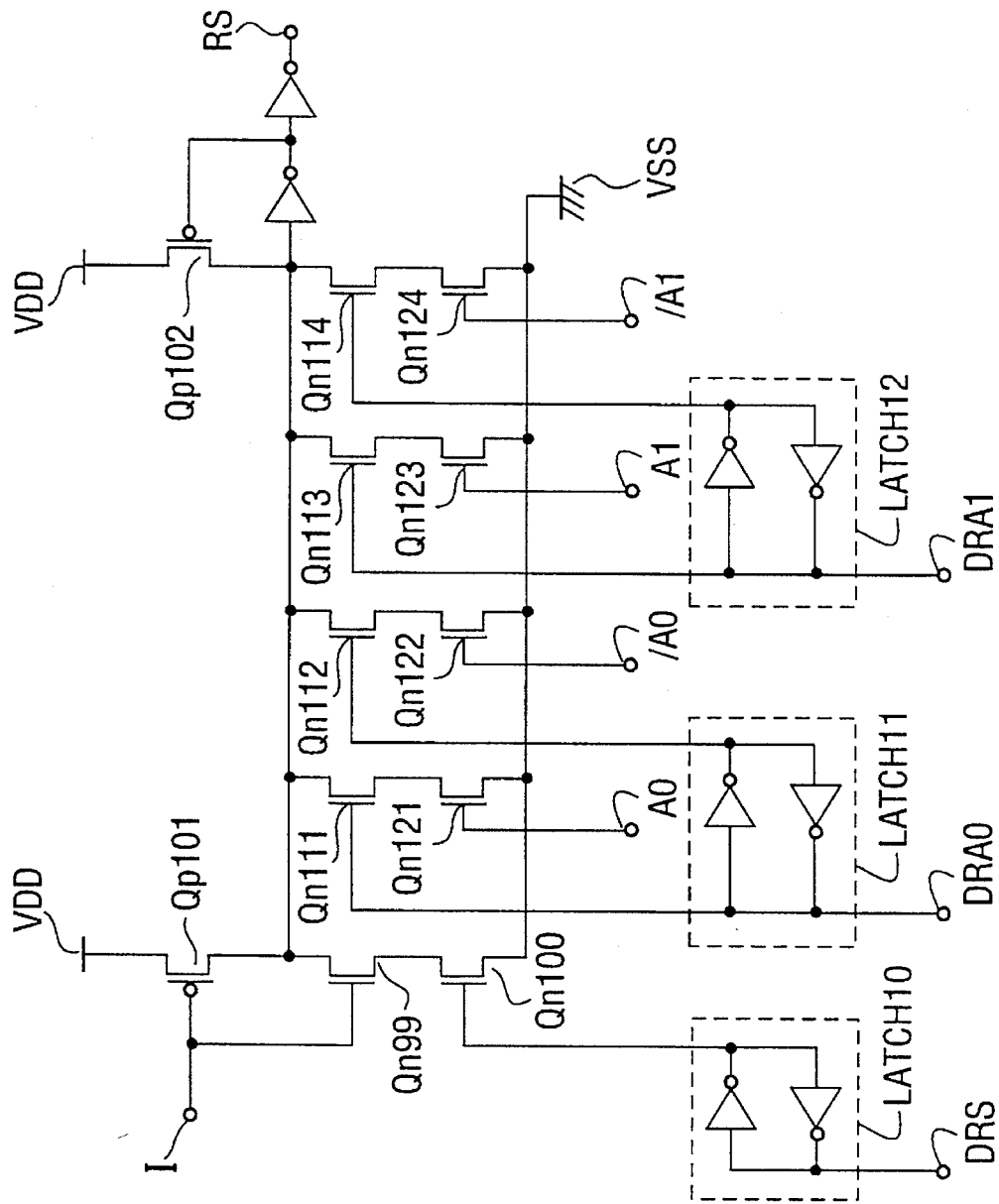
FIG. 2 is the circuit diagram of a redundant memory cell selecting circuit with a semiconductor memory device according to the second embodiment of the invention.
Figure 3:
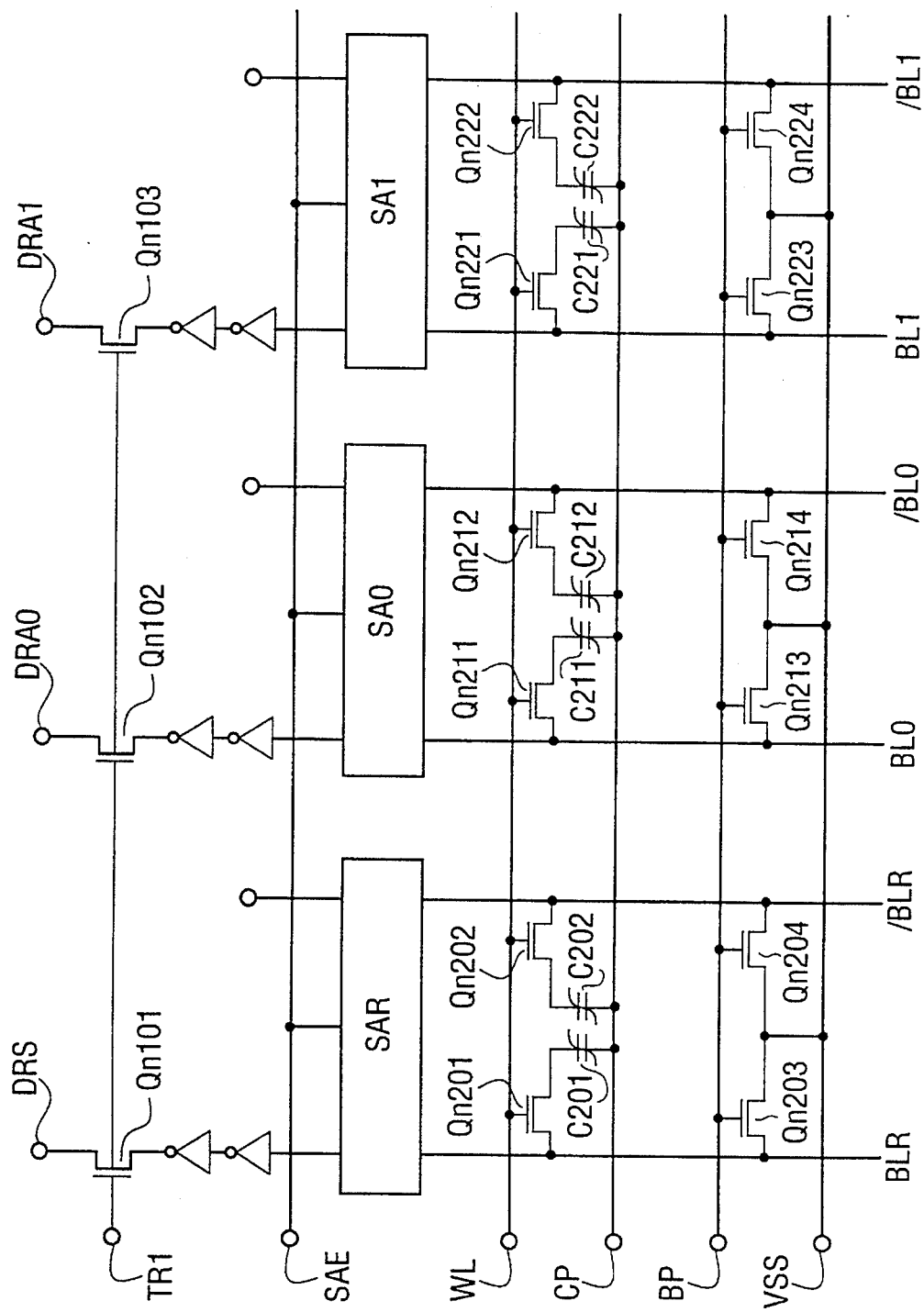
FIG. 3 is the circuit diagram of a redundant address data cell of the semiconductor memory device according to the second embodiment of the invention.

A semiconductor memory device of a second embodiment is a practical example of the first embodiment where a selected circuit shown in FIG. 2 is employed for the redundant memory cell selecting circuit 16 and an memory circuit shown in FIG. 3 is employed for the redundant address data cell 17.

The redundant memory cell selecting circuit shown in FIG. 2 comprises P-channel type MOS transistors Qp101 and Qp102, N-channel type MOS transistors Qn101, Qn100, Qn111 to Qn114, and Qn121 to Qn124 and first latch circuits LATCH10, LATCH11 and LATCH12.

This selecting circuit is supplied with, address data A0, /A0, A1, and /A1 from the input terminal 18, signals DRS, DRA0, and DRA1 from the memory circuit of FIG. 3 (corresponding to the redundant address data cell 17), a selecting signal RS operative to select the redundant memory cell 12, a control signal I, voltage source VDD and ground potential VSS. Here the slash ("/") before the address data denotes the inverse logic of the address data.

In the initial state, the control signal I is set to a logical voltage of "L" (low voltage), then the MOS transistor Qp101 is switched to an on-state, then the drain voltage thereof and eventually the selecting signal RS become a logical voltage of "H" (high voltage), respectively. When the selecting signal RS is "H" the redundant memory cell 12 is to be selected, and if it were "L", the main memory cell 11 is selected.

When a failed memory cell in the main memory cell 11 is replaced by a memory cell in the redundant memory cell 12, provided that the address data A0 and A1 of the failed memory cell is specified as "H" and "L," respectively, data is to be written in the memory circuit of FIG. 3 (the address data cell) in the manner so as to output signals DRS of "H", DRA0 of "L", and DRA1 of "H". On the other hand, when the redundant memory cell 12 is not used, "L" is written for the signal DRS, thereby turning the selecting signal RS to "L" and in this state any address data input never allows selection of the redundant memory cell 12.

The memory circuit of FIG. 3, corresponding to the redundant address data cell 17, comprises N-channel type MOS transistors Qn101 to Qn103, Qn201 to Qn204, Qn211 to Qn214, and Qn221 to Q224, ferroelectric capacitors C201, C202, C211, C212, C221 and C222, and sense amplifiers SAR, SA0 and SA1. This circuit operates with a control signal TR1 for controlling the MOS transistors Qn101 to Qn103, a control signal SAE for controlling the sense amplifiers SAR, SA0 and SA1, a word line WL, a cell plate electrode CP, and a signal BP for precharging bit lines BLR, /BLR, BL0, /BL0, BL1 and /BL1. Here VSS is a ground.

Figure 4:
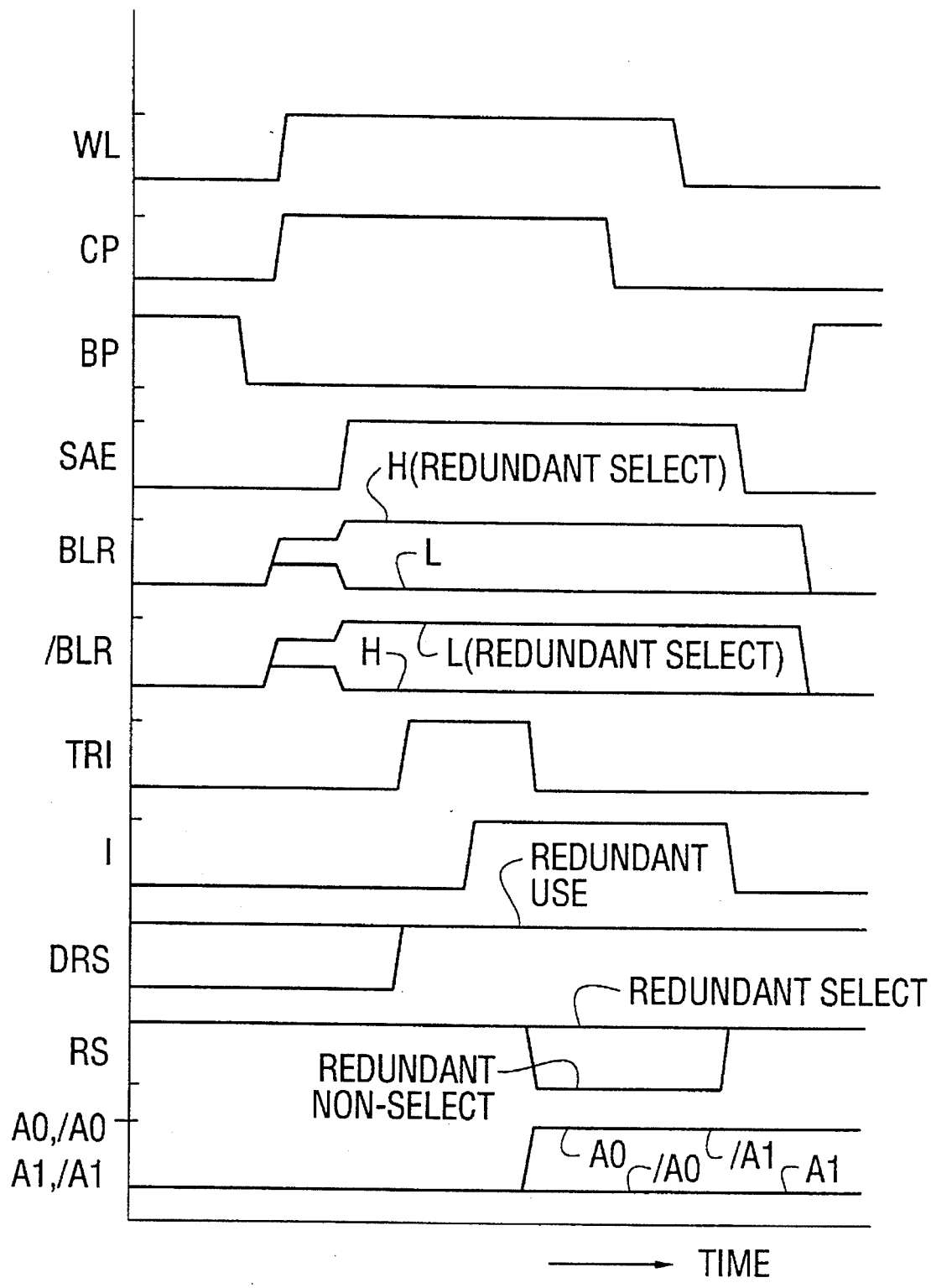
FIG. 4 is a operation timing diagram during selecting the redundant address according to the second embodiment of the invention.

The operation of the semiconductor memory device will be explained, referring to the operation timing diagram of FIG. 4. In the initial state, a precharge signal BP is set to "H", thereby turning the MOS transistors Qn203, Qn204, Qn213, Qn214, Qn223 and Qn224 to an on-state, thus lowering to a ground potential the bit lines BLR, /BLR, BL0, /BL0 and /BL1.

Next, after the precharge signal BP is shifted to "L", the word line WL and the cell plate electrode CP are shifted to "H", thereby turning to an on-state the MOS transistors Qn201, Qn202, Qn211, Qn212, Qn221 and Qn222, thus charges are read out onto the bit lines from the ferroelectric capacitors C201, C202, C211, C212, C221 and C222.

Then the control signal SAE is shifted to "H", thereby putting into operation the sense amplifiers SAR, SA0 and SA1, thus amplifying the voltage differences between the bit lines. When the redundant memory cell part 12 is to be selected, the bit lines BLR and /BLR are shifted to "H" and "L", respectively.

Then the control signal TR1 is shifted to "H", thereby turning to an on-state the MOS transistors Qn101 to Qn103. At this time the signal DRS is "H", and "L" is output from the first latch circuit LATCH10 and is applied on the gate of the MOS transistor Qn100, thus turning to an off-state the MOS transistor Qn100. Therefore the redundant memory cell selecting circuit 16 is in the waiting state for selection of the redundant memory cell 12.

If, in this state, the address data A0 and /A1 are input with "H" and the address data /A0 and A1 are input with "L", and simultaneously signals DRA0 and DRA1 are output with "L" and "H", respectively, from the memory circuit of FIG. 3 (the redundant address data cell), then the selecting signal RS is output in the following manner:

The signal DRA0 is "L", thereby putting the MOS transistor Qn111 into an off-state, and the address data A0 is "H", thereby putting MOS transistor Qn121 into an on-state, and consequently this path is in the cut-off state. "H" is the output from the latch circuit LATCH11, thereby putting the MOS transistor Qn112 into an on-state, and the address data /A0 is "L", thereby putting the MOS transistor Qn122 into an off-state, and consequently this path is in a cut-off state.

Similarly, the MOS transistor Qn113 is in an on-state, while the MOS transistor Qn123 is in an off-state, and consequently this path is also in the cut-off state. Furthermore, the MOS transistor Qn114 in an off-state, while the MOS transistor Qn124 is in an on-state, and consequently this path is in a cut-off state. Still furthermore, the drain of the MOS transistor Qp101 is being held in "H", and a selecting signal RS of "H" is output. Namely, the redundant memory cell 12 is selected.

As described above, in this embodiment the redundant memory cell selecting circuit 16 has latch circuits and the redundant address data cell 17 has memory cells comprising a ferroelectric capacitor and a MOS transistor. Upon application of voltage, first address data read from the redundant address data cell 17 is held in the latch circuits. For this reason it is possible at high speed to select either the main memory cell 11 or the redundant memory cell 12.

Figure 5:
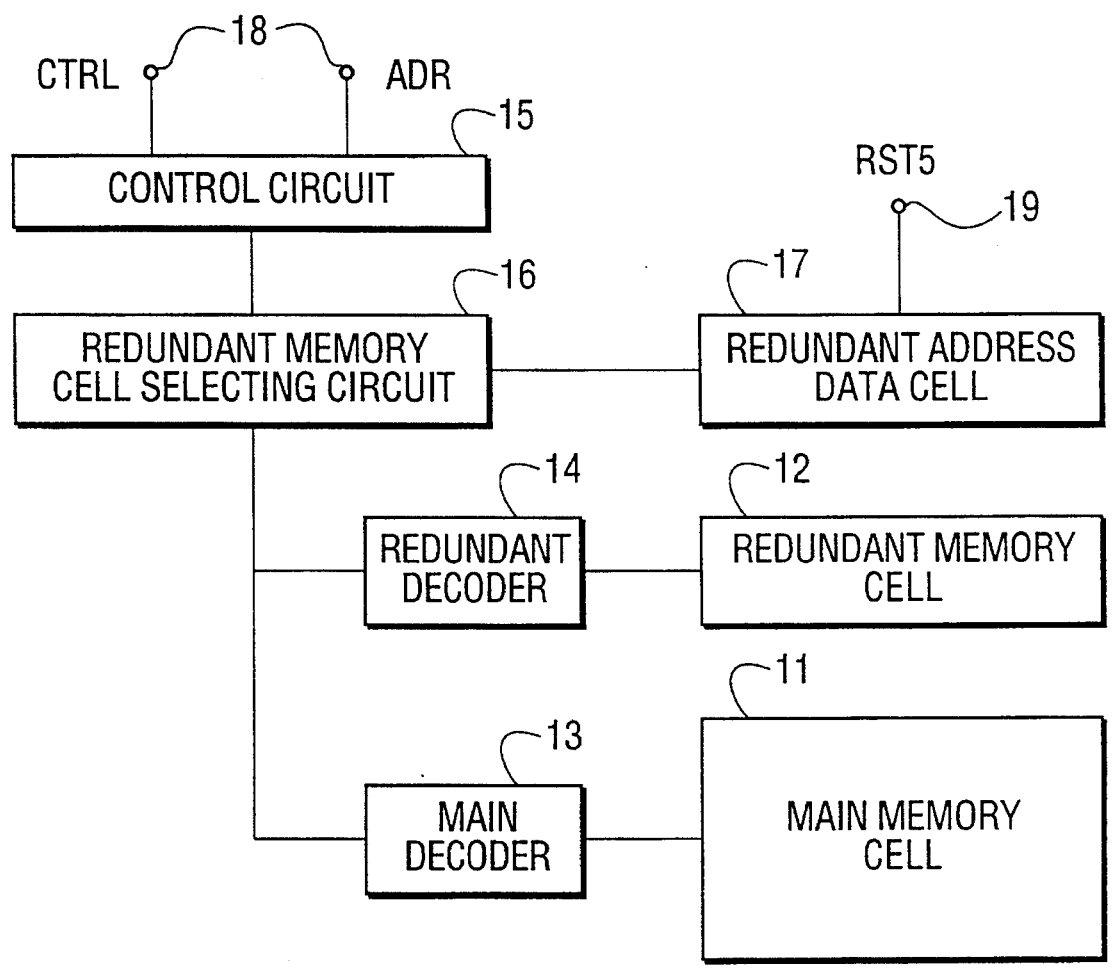
FIG. 5 is the circuit block diagram of a semiconductor memory device according to the third embodiment of the invention.

Another variation of the invention is depicted in FIG. 5. The basic structure of a semiconductor memory device shown in FIG. 5 is similar to the embodiment of FIG. 1. However, the embodiment of FIG. 5 is provided with an input terminal 19 for input of a control signal RST5 in order to put into operation the redundant address data cell 17. If the control signal RST5 is not input, the redundant address data cell 17 is not put into operation.

In the embodiment of FIG. 5, a selecting circuit as shown in FIG. 2 is employed for the redundant address selecting circuit 16, and a memory circuit as shown in FIG. 3 is used for the redundant address data cell 17. The control signal generating circuit for generating a control signal RST5 is not shown in FIG. 5.

Figure 6:
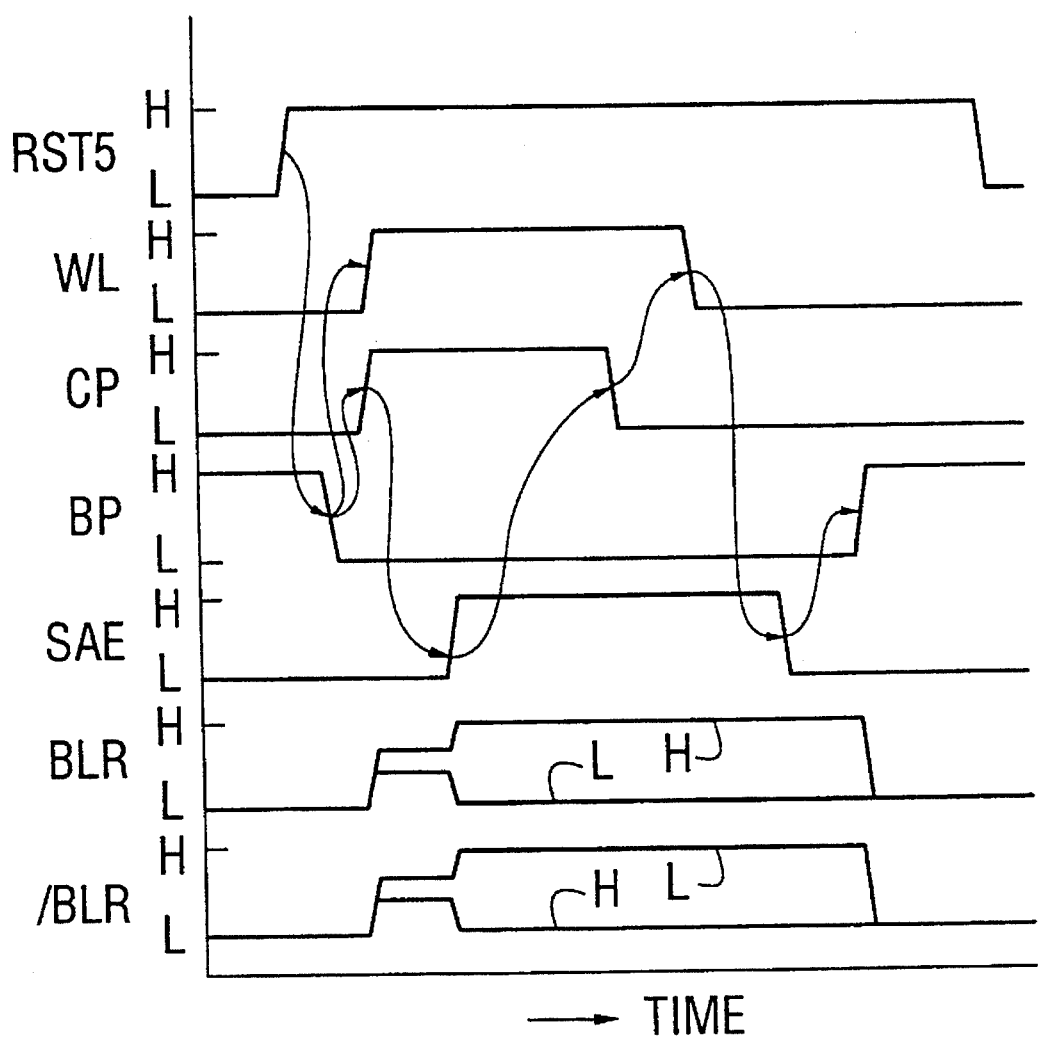
FIG. 6 is a operation timing diagram for the semiconductor memory device of FIG. 5.

The operation of this semiconductor memory device will be explained referring to FIG. 3 and FIG. 6. Arrows in FIG. 6 represent the sequence of operation.

At the initial state, a precharge signal BP is "H", thus all bit lines being fixed to ground potential. After a control signal RST5 at the input terminal 19 is shifted to "H", a precharge signal BP is shifted to "L". Next, shifting into "H" both the word line WL and the cell plate electrode CP, charges are read out from the ferroelectric capacitors C201, C202, C211, C212, C221 and C22 into the bit lines BLR, /BLR, BL0, /BL0, BL1, /BL1. Then, the control signal SAE is shifted to "H", thereby putting into operation the sense amplifiers SAR, SA0 and SA1 so as to amplify potential differences between the bit lines. Next, after the cell plate electrode CP is shifted to "L". Then, after the precharge signal BP is shifted to "H," thereby fixing the bit lines to ground potential, the control signal RST5 is turned back to "L".

Next, data for selecting or not selecting the redundant memory cell 12 is stored in the first latch circuits LATCH11 and LATCH12. Since this step is the same as explained in the second embodiment, further explanation is omitted.

As described above, by controlling the redundant address data cell 17 with a control signal RST5 supplied from the control signal generating circuit, it is possible that after data is read from the redundant address data cell 17 into the redundant memory cell selecting circuit 16, the redundant address data cell 17 is held inactive, thereby enabling simplification of operation and reducing power consumption.

Figure 7:
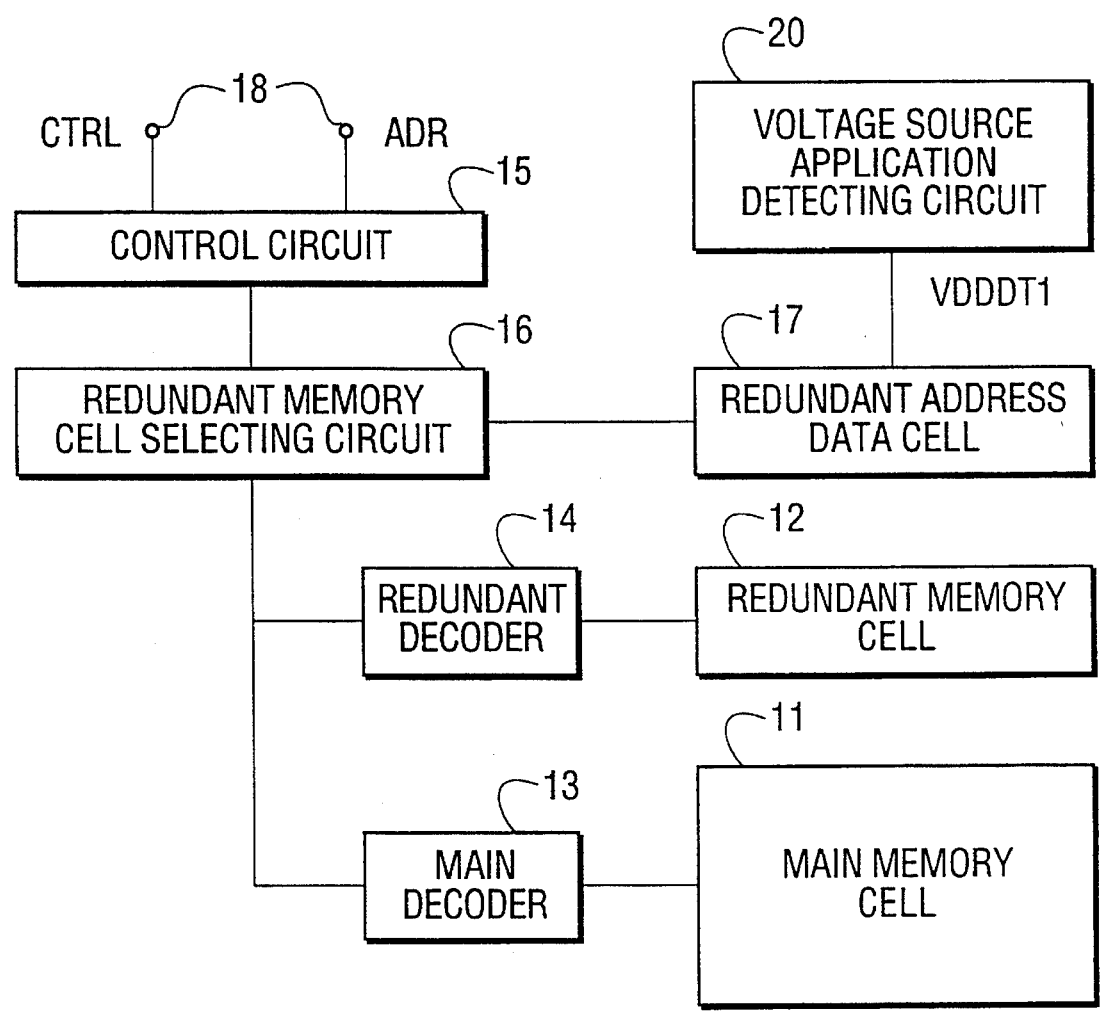
FIG. 7 is the circuit block diagram of a semiconductor memory device according to the fourth embodiment of the invention.

In yet another variation, the semiconductor memory device of FIG. 7 shows a modified example of the third embodiment. Instead of the input terminal 19 of FIG. 5 for inputting a control signal RST5 in the third embodiment, this embodiment has a detecting circuit 20 for outputting a control signal VDDDT1 upon detecting an application of a voltage source.

Figure 8:
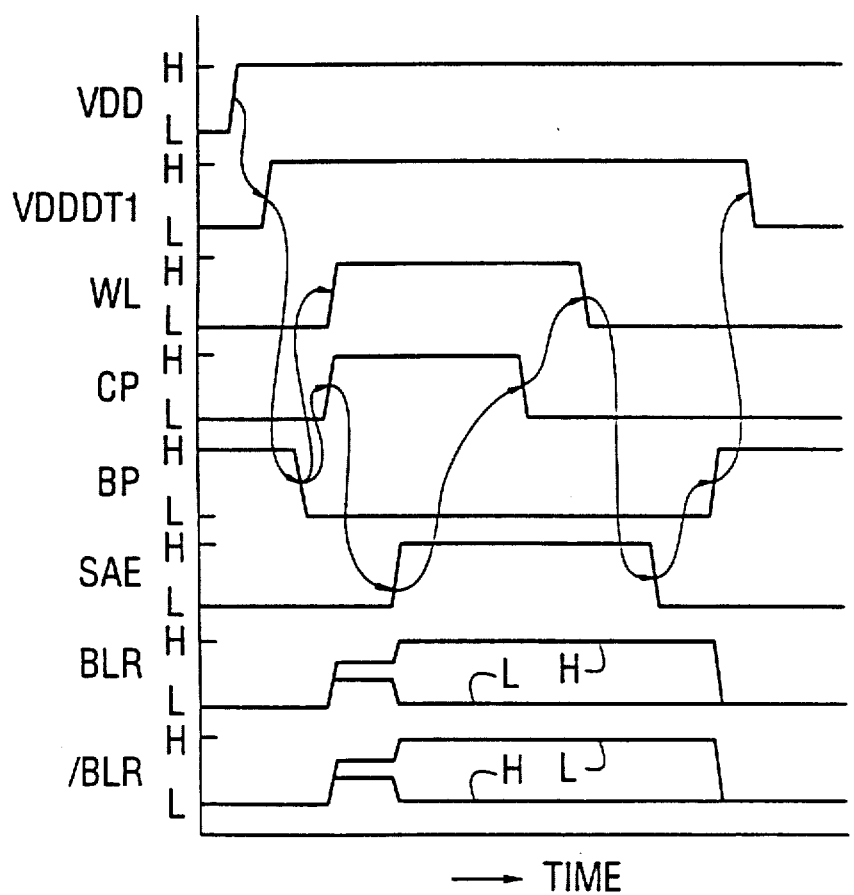
FIG. 8 is a operation timing diagram for the semiconductor memory device of FIG. 7.

The operation of this semiconductor memory device will be explained, referring to FIG. 3 and FIG. 8. Arrows in FIG. 8 represent the sequence of operation.

In the initial state, a precharge BP is "H", thus all the bit lines being fixed to ground potential. When applying a voltage source, a source voltage VDD becomes "H" and a control signal VDDDT1 of "H" is output from the detecting circuit 20. After that a precharge signal BP is shifted to "L". Then the word line WL and the cell plate electrode CP are set to "H", and charges are read from the ferroelectric capacitors C201, C202, C211, C212, C221 and C222 into the bit lines. Shifting a control signal SAE to "H", the sense amplifiers SAR, SA0 and SA1 are put into operation, thus amplifying potential differences between the bit lines. Next, after the cell plate electrode CP is shifted to "L", the word line WL is shifted to "L" and the control signal SAE is shifted to "L". Next, after the precharge signal BP is shifted to "H" to fix the bit lines to ground potential, the control signal VDDDT1 is shifted to "L".

Next, data for selecting or not selecting the redundant memory cell 12 are stored in the first latch circuits LATCH11 and LATCH 12. Since this step is the same as explained in the second embodiment, further explanation is omitted.

In this manner, by putting into operation the redundant memory cell 12 with a control signal VDDDT1 supplied by the detecting circuit 20, a series of operations for storing data for selecting or not selecting the redundant memory cell 12 into the redundant memory cell selecting circuit 16 can be started at the same time as the voltage source is applied.

Figure 9:
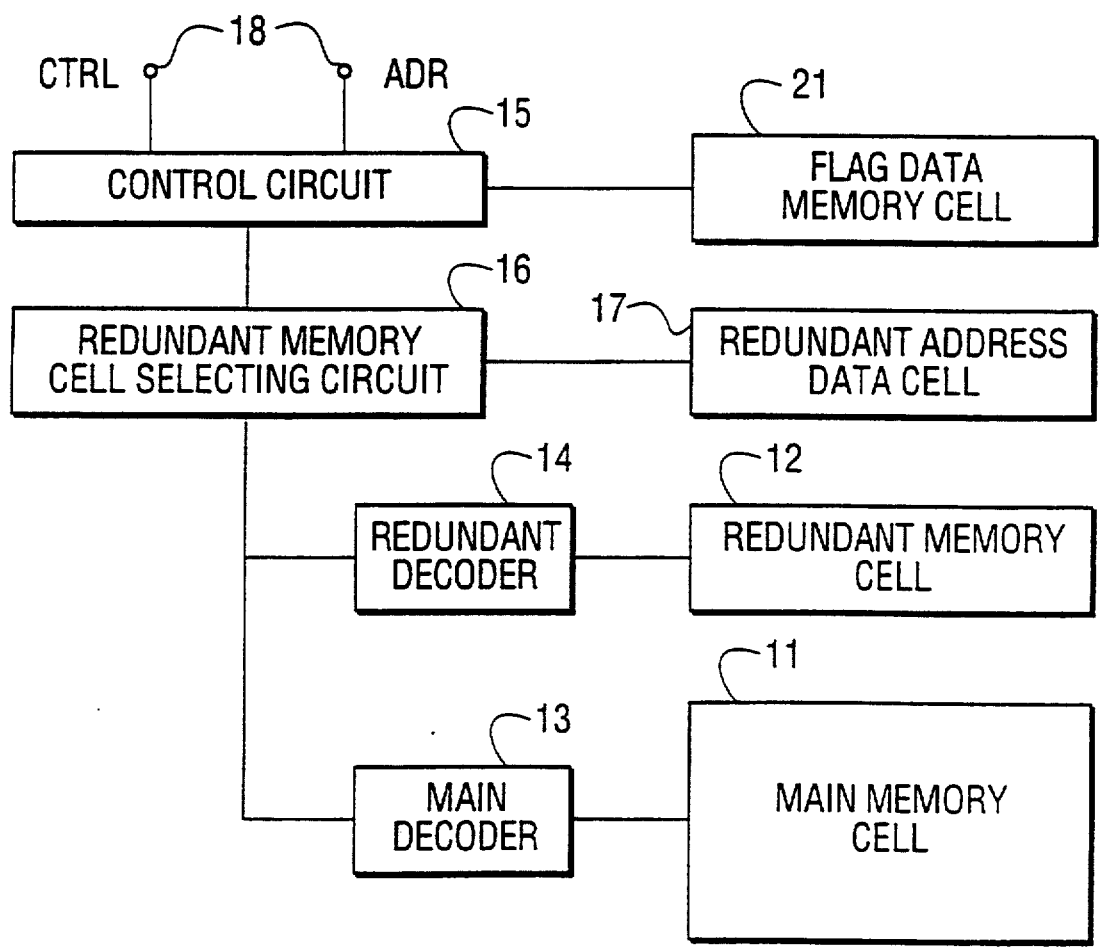
FIG. 9 is the circuit block diagram of a semiconductor memory device according to the fifth embodiment of the invention.

In another variation, the semiconductor memory device shown in FIG. 9 is an example of the first embodiment, where the control circuit 15 is provided with a flag data memory 21 for storing flag data indicating that the first address data has been read from the redundant address data cell 17.

Figure 10:
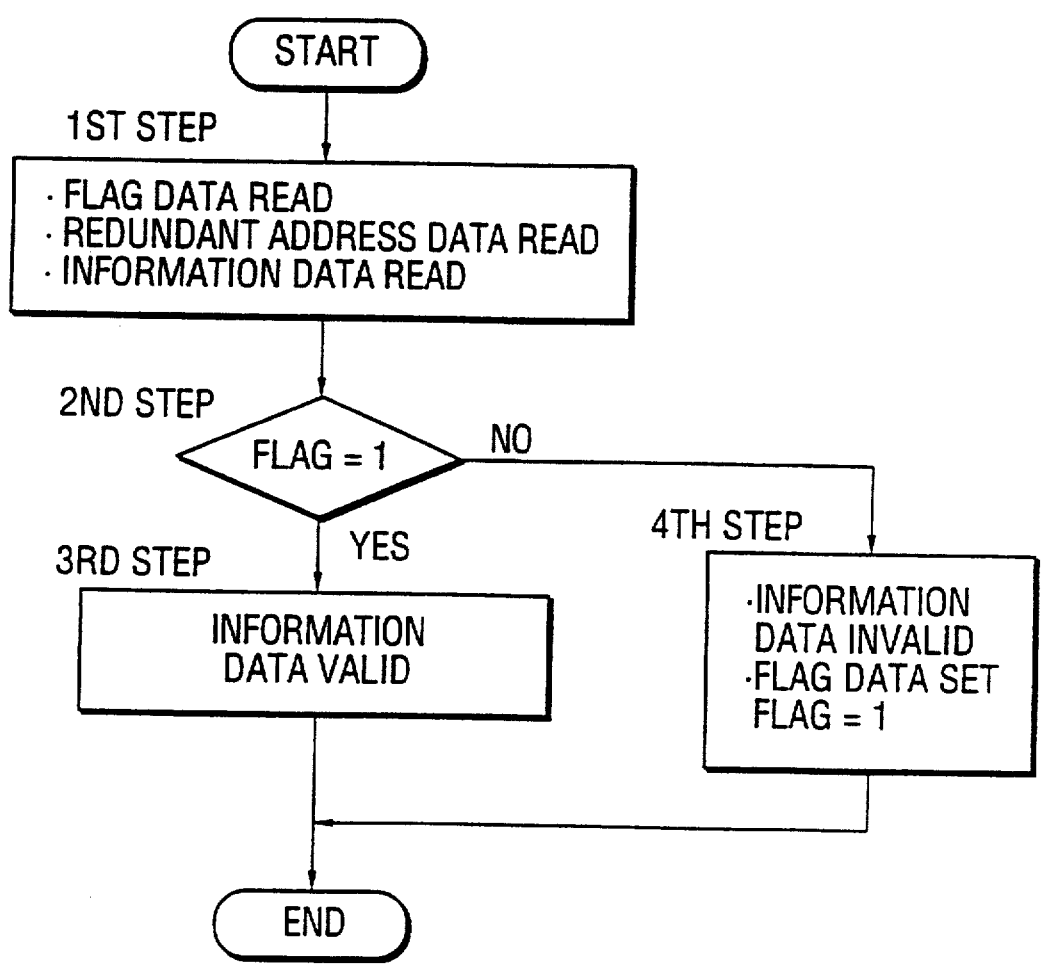
FIG. 10 is a flow chart for explaining the operation of the semiconductor memory device of FIG. 9.
Figure 11:
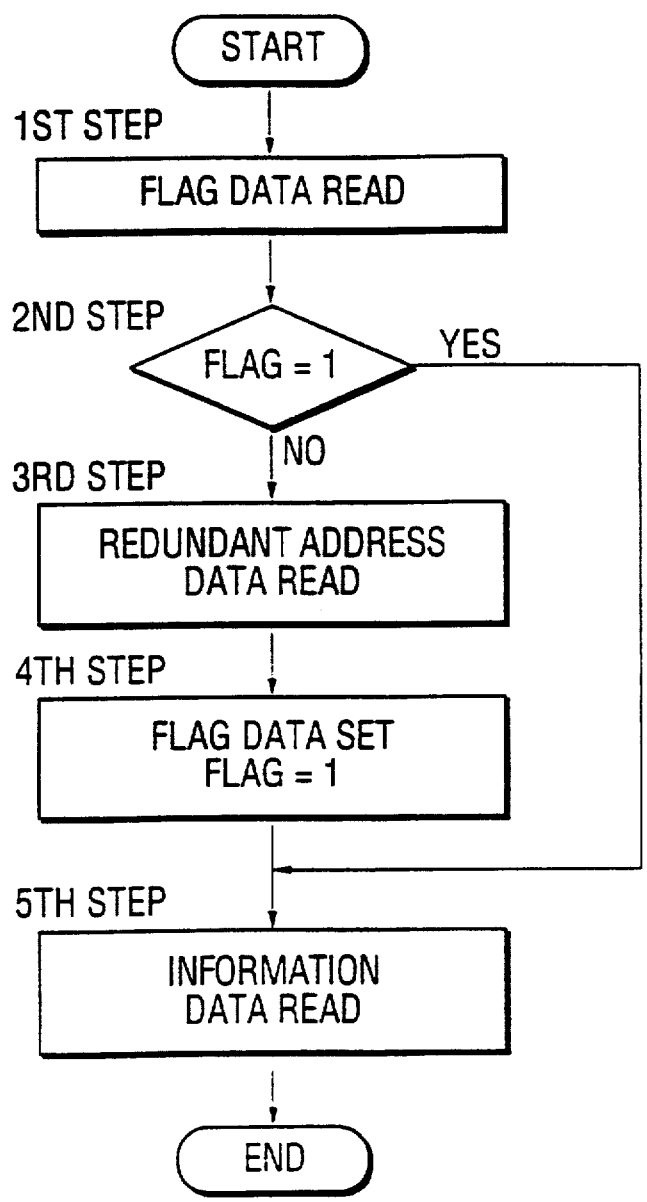
Figure 12:
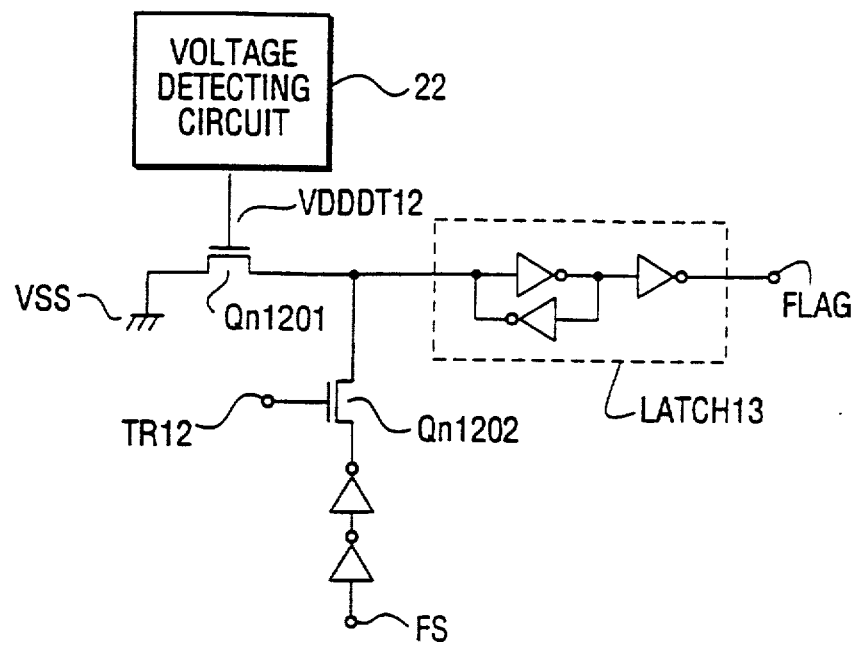
Figure 13:
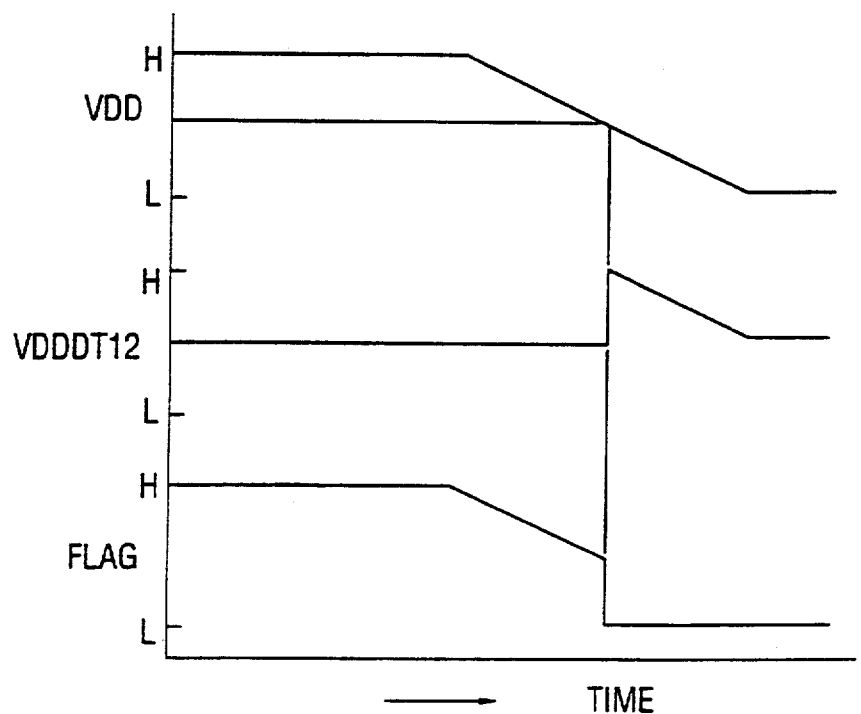
Figure 14:
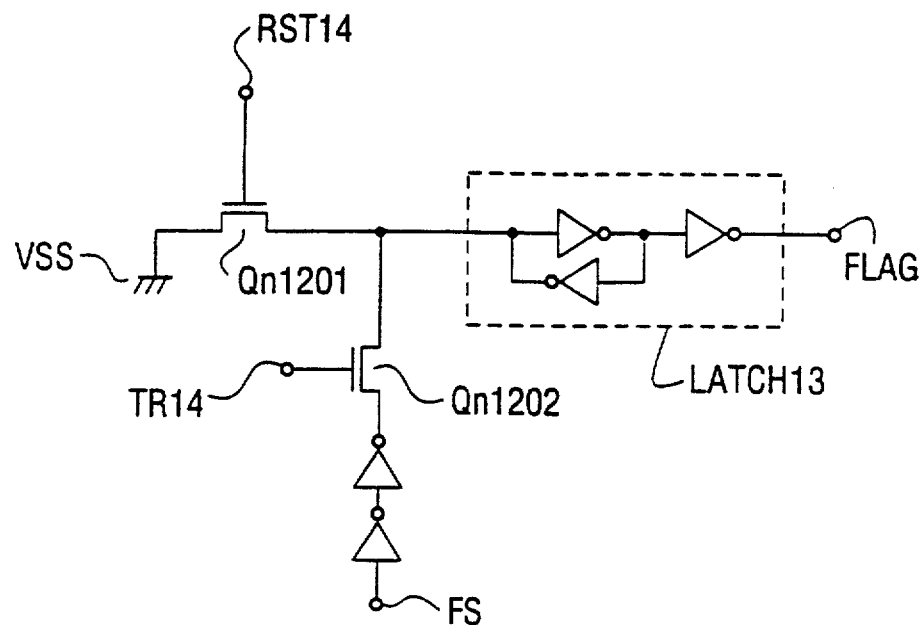

The operation of this semiconductor memory device will be explained referring to the flow chart of FIG. 10. When a voltage source is applied, flag data is not set, as indicated by FLAG=0. FLAG=1 indicates that the flag is set.

In the first step, flag data from the flag data memory 21, first address data from the redundant address data cell 17, and information data from the main memory cell 11 are read.

In the second step, a judgment is made whether the flag data is set or not, namely, FLAG=1 or FLAG=0. If the flag data is not set, namely FLAG=0, then the information data is to be regarded as invalid at the fourth step, and the flag data is set in the flag data memory 21. Consequently, until the supply voltage is cut off, the first address data read is held in the redundant memory cell selecting circuit 16, and a flag data in the flag data memory 21 is set.

Therefore, until the source voltage is cut off, the first address data is held in the redundant memory cell selecting circuit 16, and the flag data is set in the flag data memory 21 indicating that the information data is valid.

For this reason, for the subsequent read operations, at the first step a flag from the flag data memory 21, first address data from the redundant address data cell 17, and information data from the main memory cell part 11 are read.

At the second step, FLAG=1. Operation then proceeds to the third step indicating therein that the information data is valid. This information is output until the voltage source is cut off.

In this manner, during the second and subsequent read operations, information data is read as valid either from the main memory cell 11 or the redundant memory cell 12.

Figure 11:
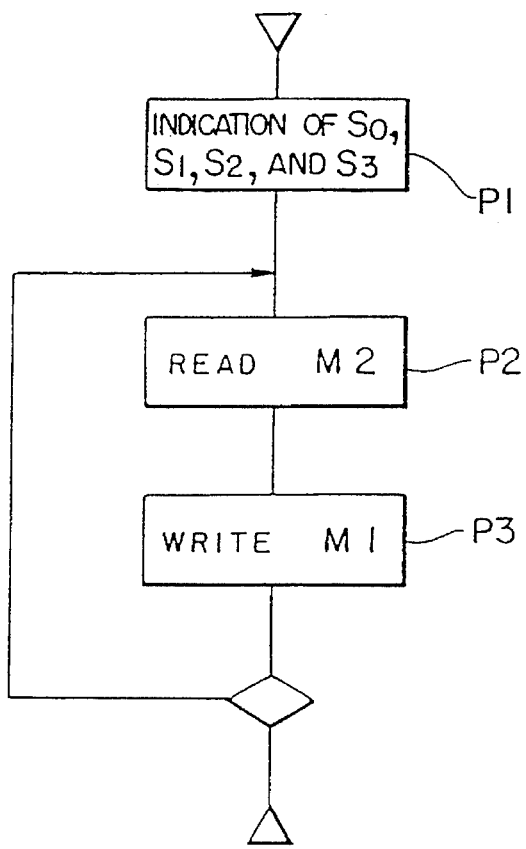
FIG. 11 is another flow chart for explaining the operation of the semiconductor memory device of FIG. 9.

FIG. 11 shows another flow chart. In this case, at the first step flag data is read from the flag data memory 21. At the second step a judgment is made whether the flag data is set or not, namely, FLAG=1 or FLAG=0. If the flag data is not set, namely, FLAG=0, then the first address data is read from the redundant address data cell 17 at step 3. At the fourth step, the flag data is set in the flag data memory 21. Finally, at the fifth step the information data is read.

On the other hand, provided that, at the second step, the flag data has been set, namely FLAG=1, processing moves to the fifth step where the information data is read. Since the flag data is set in the flag data memory 21 until the voltage source is cut off, it is possible, in the second and subsequent read operations, that as soon as a flag data is read from the flag data memory 21 at the first step, the information data is read at the fifth step, thus enabling the high-speed reading operation of information data.

Figure 12:
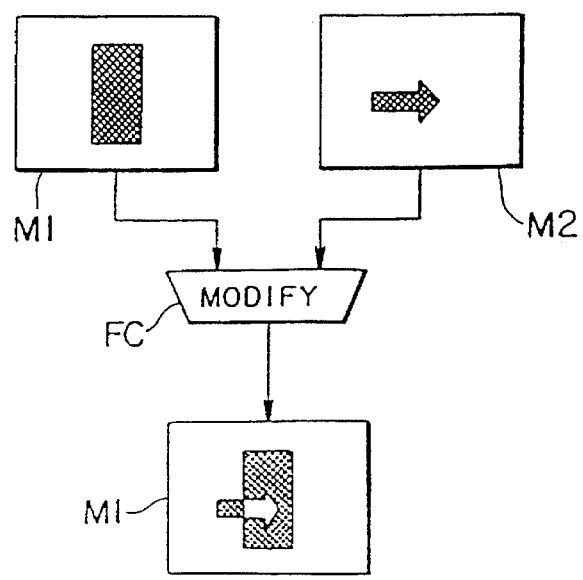
FIG. 12 is the circuit diagram of a flag data memory of a semiconductor memory device according to the sixth embodiment of the invention.

Another variation on the semiconductor memory device of this invention is partially depicted in FIG. 12. The semiconductor memory device of this embodiment is an example of the fifth embodiment where a memory circuit having a latch circuit is employed for the flag data memory 21.

The flag data memory circuit shown in FIG. 12 contains a voltage detecting circuit 22 which outputs a control signal VDDDT12 of "H" when a source voltage is less than a specified value, and a second latch circuit LATCH13. The input terminal of the second latch circuit LATCH13 is connected to a transistor Qn1201 which is controlled by a control signal VDDDT12 from the voltage detecting circuit 22 and a transistor Qn1202 which is controlled by a control signal RST12. The transistor Qn1201 serves to put the input terminal of the second latch circuit LATCH13 into ground potential VSS by the control signal VDDDT12. The transistor Qn1202 serves to supply the input terminal of the second latch circuit LATCH13 with a signal FS which is of the same logical voltage used to set the flag data. As long as the voltage source is applied, the flag data is held in the second latch circuit LATCH13.

The operation of this flag data memory circuit will be explained, particularly in the case of resetting.

Figure 13:
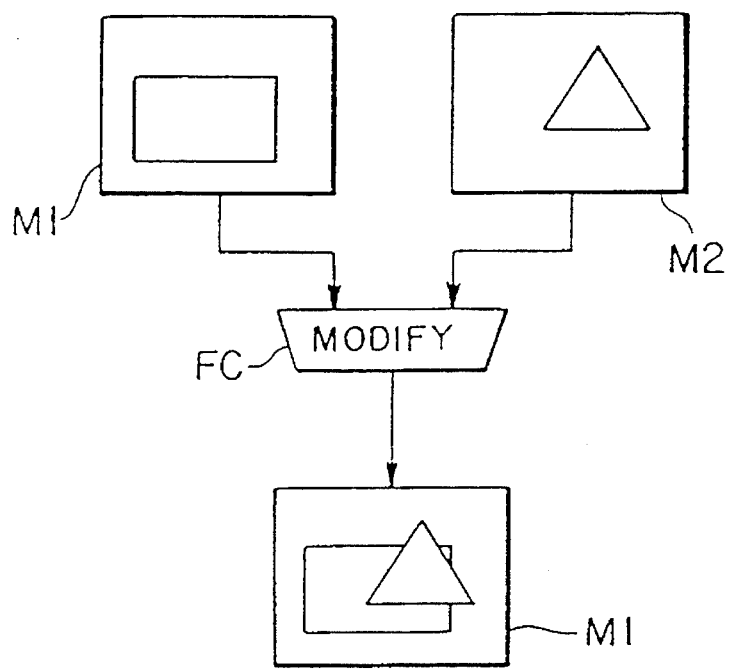
FIG. 13 is a diagram for explaining the operation of the flag data memory of FIG. 12.

As shown in FIG. 13, when switching off the voltage source, the source voltage VDDDT12 begins to decrease and falls below a specified value, thereby putting into operation the voltage detecting circuit 22 to output the control signal VDDDT12 of "H". Together with the decrease of the source voltage, the voltage level of the flag data output from the second latch circuit LATCH13 begins to decrease. The MOS transistor Qn1201 is switched on by the control signal VDDDT12, and the input terminal of the second latch circuit LATCH13 is grounded to VSS, therefore the voltage level of the flag data becomes ground potential VSS. Namely, the second latch circuit LATCH13 holding the flag data is automatically reset when the voltage source is cut off.

Figure 14:
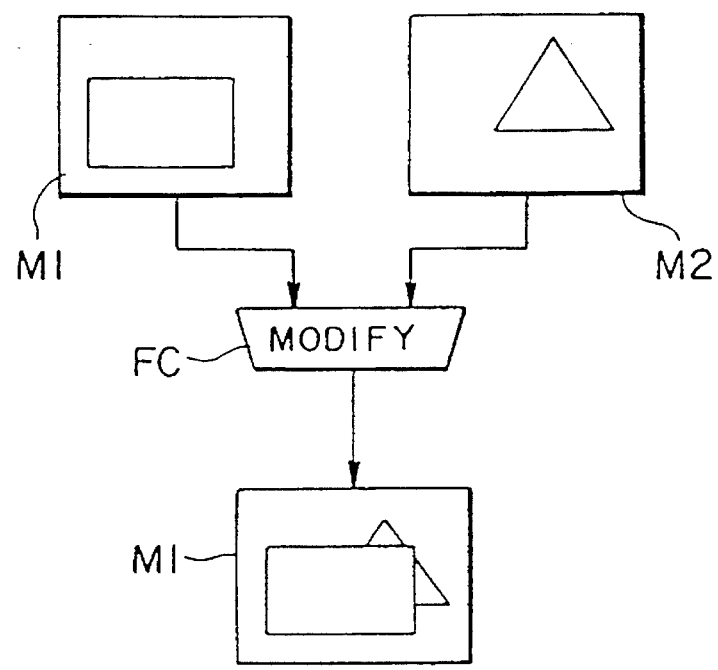
FIG. 14 is the circuit diagram of a flag data memory of a semiconductor memory device according the seventh embodiment of the invention.

In yet another embodiment the semiconductor memory device is a modified example of the sixth embodiment. The difference between this embodiment and the sixth embodiment, as shown in the flag data memory circuit of FIG. 14, is that the gate of the MOS transistor Qn1201 which serves to reset the latch circuit LATCH13 by grounding its input terminal is controlled not by a control signal VDDDT12 from the voltage detecting circuit 22, but by a control signal RST14 generated from an external reset signal generating circuit (now shown).

Figure 15:
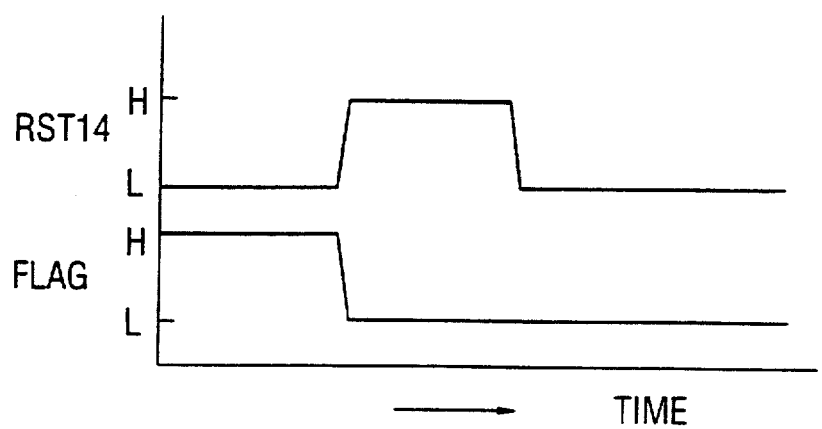
FIG. 15 is a diagram for explaining the operation of the flag data memory of FIG. 14.
Figure 19:
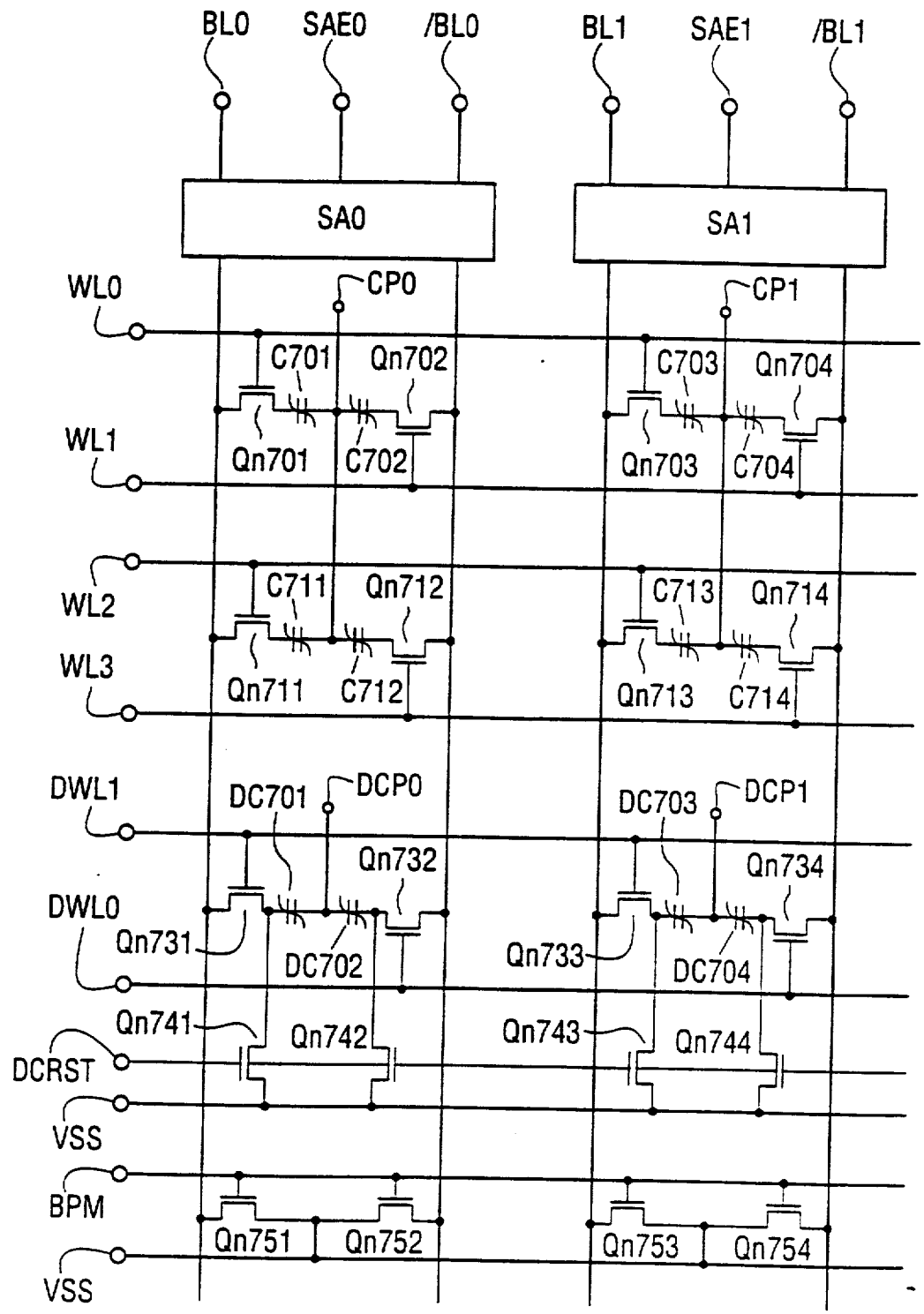

As shown in FIG. 15, when the control signal RST14 is set to "H", the MOS transistor Qn1201 is switched on, thus, the input terminal of the second latch circuit LATCH13 being connected to ground. When the second latch circuit LATCH13 is reset, the control signal RST14 is returned to "L", and the control signal RST14 is afterward set to "H", thereby preparing for a signal FS to get to the input terminal of the second latch circuit LATCH13. In this manner, the second latch circuit LATCH13 holding the flag data can be reset at given time by using a control signal from an external circuit. In other words, it can be surely reset by a control signal before the voltage source is cut off.

Figures 16, 17:
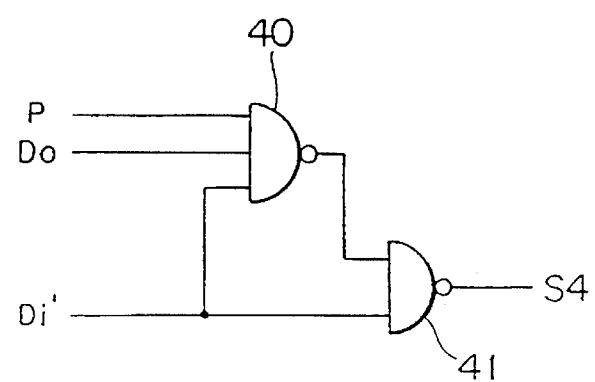
FIG. 16 is the circuit block diagram of a semiconductor memory device according to the eighth embodiment of the invention.
FIG. 17 is a diagram for explaining the operation of the semiconductor memory device of FIG. 16.

The semiconductor memory device shown in FIG. 16 is a modified example of the first embodiment. The difference between this embodiment and the first embodiment is that the redundant memory cell 12 and the redundant address data cell 17 of FIG. 1 are both contained in the memory domain 23, and the control circuit 15 and the redundant memory cell selecting circuit 16 are incorporated into one domain 24. In other words, the memory domain 23 of FIG. 16 comprises a redundant address data cell domain 23a, a redundant memory cell domain 23b and a flag data domain 23c. Therefore, if there is a failed memory cell in the main memory cell 11, the address data of the failed memory cell, the information data, and the flag data which indicates the meaning and application state of information data are written, respectively, in the memory domain 23.

Next, an example of assignment of the memory domain 23 will be explained. Although the memory domain 23 is drawn as divided by dotted lines for clarity of explanation in FIG. 16, the redundant address data, the information data and the flag data are virtually merged and written in as a whole as shown in FIG. 17.

FIG. 17 gives an example having four failed memory cells in the main memory cell 11 and the failed memory cells are replaced by those in the redundant memory cell domain 23a. It should be noted that although the redundant addresses in the left column of FIG. 17 covers 0 to 15 as an example, the number of addresses is not restricted.

As shown in FIG. 17, for example, an address 0 of a failed memory cell in the main memory cell 11 (hereinafter referred to as an external address 0) and a redundant address 5 used for storage of the information data which replaced the failed memory cell are written in the data domain of a redundant address 0. The data domain of this redundant address 0 corresponds to the memory cell domain 23a.

Furthermore, in the flag domain of the redundant address 0, there is an address/data column discriminating between the address data and the information data, having a 1 indicating an address; a used/not used column, having a 1 indicating used; and an OK/NG (okay/no good) column representing possible or impossible for use of the data domain, having a 1 indicating possible. This flag domain corresponds to the memory cell domain 23c.

The information data which should be written in the main memory cell 11 is written in the data domain of a redundant address 5. The redundant address 5 is used for storage of the information data, thus indicating 0 in the address/data column of the flag domain 23c. A redundant address 6 shows it memory cell failed, thus indicating NG in the OK/NG column of the flag domain. Namely, it can be seen from the flag data domain that it is impossible to use the data domain of this redundant address.

In this embodiment an explanation was given for the case wherein the redundant address data cell 17 and the redundant memory cell 12 of FIG. 1 are merged. In any case of merging two or more of either the redundant address data cell, the redundant memory cell and the main memory, the failed memory cells in the main memory cell can be replaced by memory cells in the redundant memory cell in the same manner as described above.

In the first embodiment where the redundant memory cell 12 and the redundant address data cell 17 are definitely separated, if either domain is fully occupied, it is impossible to save more failed memory cells using the space available in the part that is not full. In this embodiment, however, it is possible to save failed memory cells until the memory domain is fully occupied, thereby enhancing the freedom of saving failed memory cells.

Figure 18:
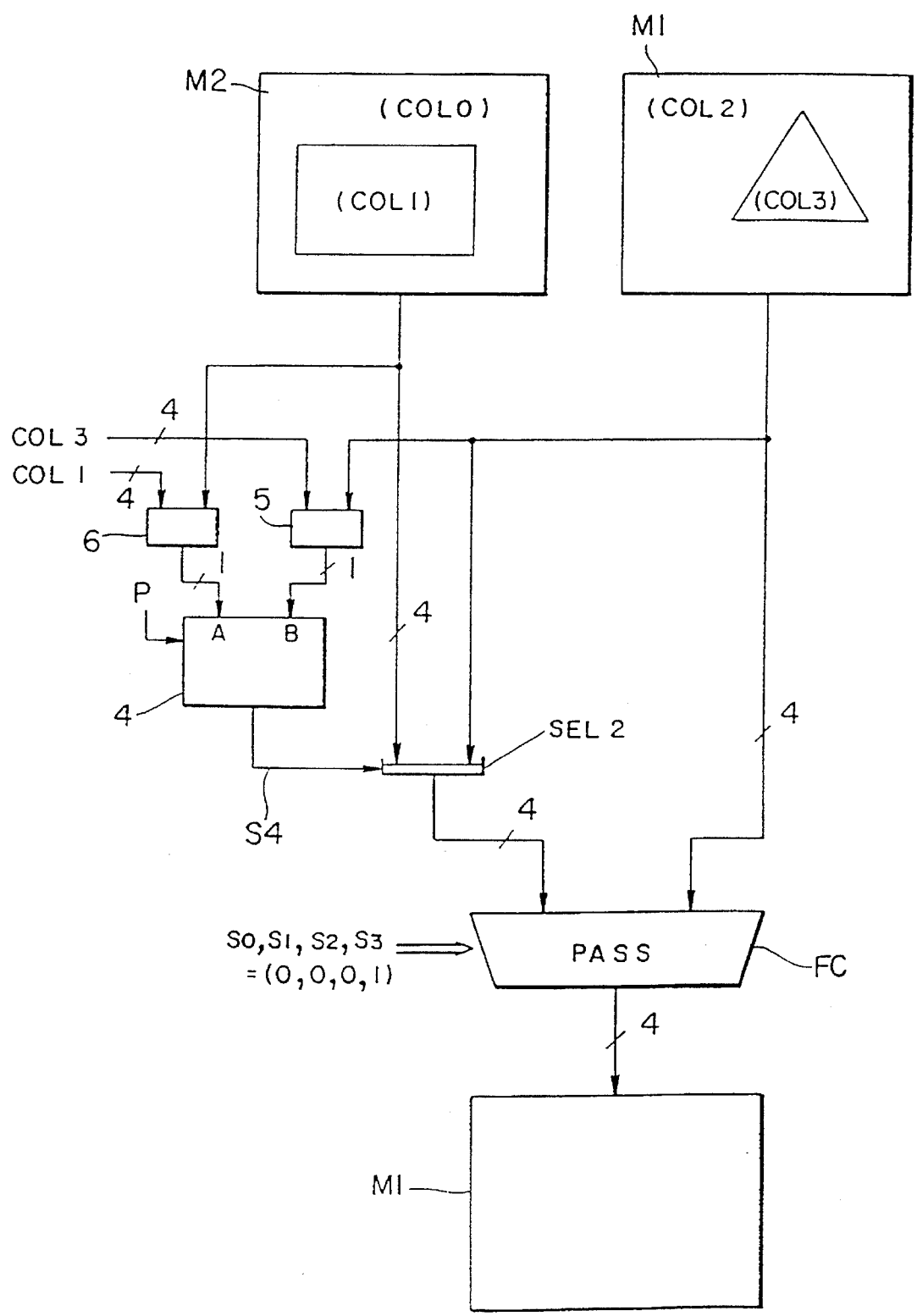
FIG. 18 is a circuit block diagram of a semiconductor memory device according to the ninth embodiment of the invention.
Figure 19:
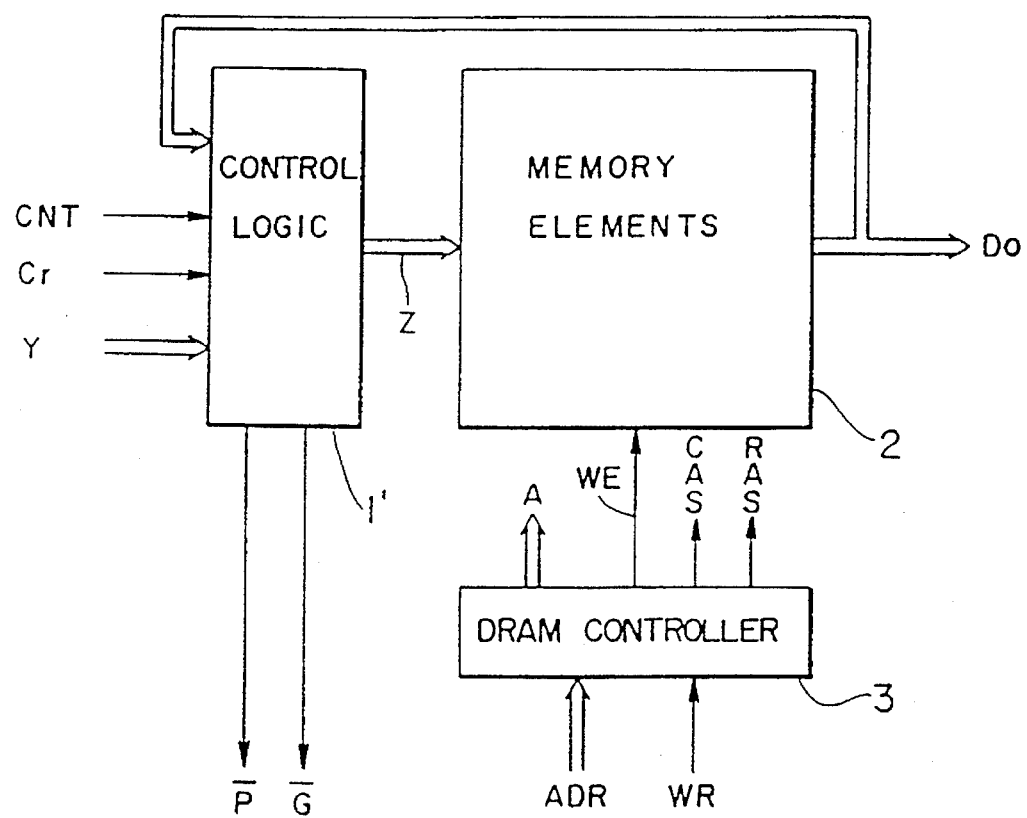
FIG. 19 is the circuit diagram of the main memory cell and the redundant memory cell of the semiconductor memory device of FIG. 18.

In yet another variation, the construction of the semiconductor memory device of FIG. 18 is the same as that of the first embodiment except the main memory cell 11 and the redundant memory cell 12 are arranged as shown in the circuit of FIG. 19. The redundant memory cell selecting circuit 16 is the same circuit as that of FIG. 2, and the redundant address data cell 17 is the same circuit as that of FIG. 3. Here Roman numerals (I), (II) and (III) represent the sequence of operation steps.

The circuit constituting the main memory cell 11 and the redundant memory cell 12, shown in FIG. 19, comprises memory cells comprising N-channel type MOS transistor Qn701 to Qn704 and Qn711 to Qn714, ferroelectric capacitors C701 to C704 and C711 to C714; dummy cells comprising N-channel type MOS transistors Qn731 to Qn734 and ferroelectric capacitors DC701 to DC704; sense amplifiers SA0 and SA1; and control transistors Qn741 to Qn744 and Qn751 to Qn754.

A memory cell, for example, consisting of the MOS transistor Qn701 and the ferroelectric capacitor C701 is connected to a bit line BL0, a word line WL0 and a cell plate electrode CP0. In the same manner the other memory cells are, as shown in FIG. 19, connected to bit lines BL0, /BL0, BL1 and /BL1, word lines WL0, WL1, WL2 and WL3, and cell plates CP0 and CP1.

A dummy cell, for example, consisting of the MOS transistor Qn731 and the ferroelectric capacitor DC701 is connected to bit line BL0, a word line DWL1 and a cell plate electrode DCP0. In the same manner the other dummy cells are, as shown in FIG. 19, connected to bit lines /BL0, BL1 and /BL1, word lines DWL0 and DWL1, and cell plate electrode DCP0 and DCP1. The sense amplifiers SA0 and SA1 which amplify voltage differences between the bit lines are controlled by control signal SAE0 and SAE1, respectively. The MOS transistors Qn741 to Qn744 are controlled by a reset signal for dummy cell DCRST and MOS transistors Qn751 to Qn754 are controlled by a precharge signal for precharging bit lines BPM.

Next, operation of the semiconductor memory device described above will be explained referring to FIG. 2, FIG. 19 and FIG. 20.

Figure 20:
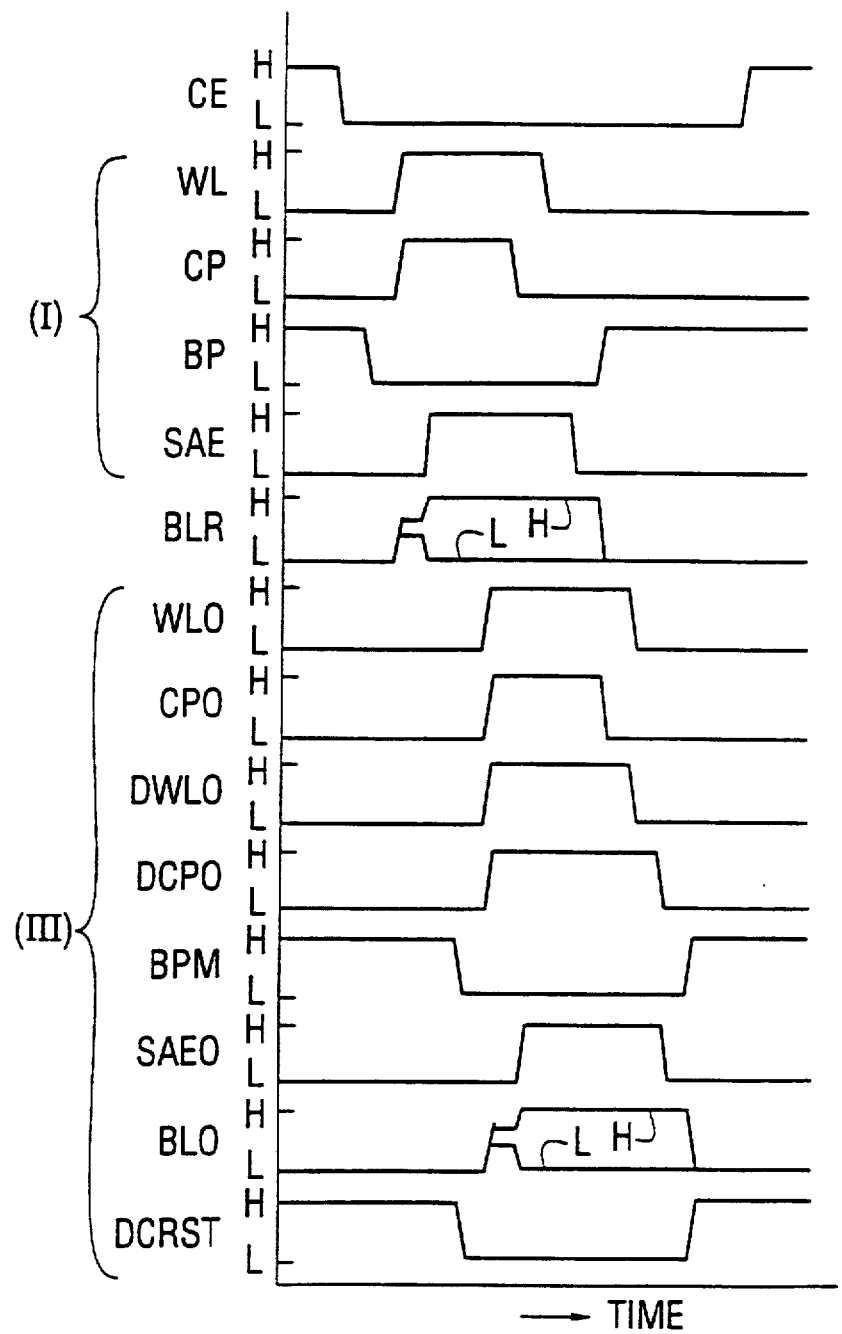
FIG. 20 is a timing diagram for explaining the method of operation the semiconductor memory device of FIG. 18.
Figure 21:
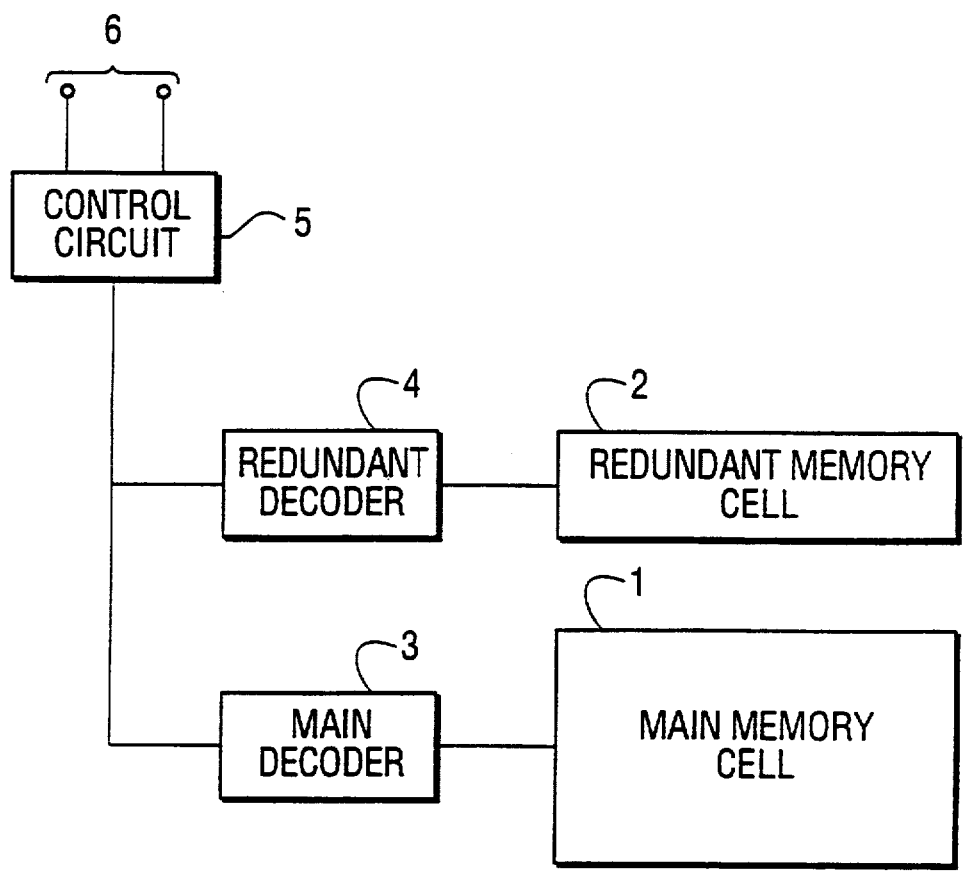

After voltage is applied, a chip-enable signal CE is shifted to "L". Then step (I) shown in FIG. 20 is carried out, i.e., data is read from the redundant address data cell 17. At this time, a signal BLR is "H" when the redundant memory cell is used, or is "L" otherwise. This operation is basically similar to that shown in the operation timing diagram of FIG. 4, thus a detail explanation is omitted.

At this time both the main memory cell 11 and the redundant memory cell 12 are in the initial state, and a precharge signal BPM and a reset signal DCRST are both "H," thus the bit lines being fixed to ground potential VSS and also the ferroelectric capacitors DC701, DC702, DC701 and DC704 of the dummy cells being all fixed to ground potential VSS.

Next, in step (II) the first address data is read from the redundant address data cell 17 into the redundant memory cell selecting circuit 16.

Next, in step (III) the information data either from the main memory cell 11 or from the redundant memory cell 12 is read.

It is to be noted that the timing chart covered by step (III) of FIG. 20 corresponds to a timing chart for reading the information data from the redundant memory cell 12 when the redundant memory cell 12 is selected, or a timing chart for reading the information data from the main memory cell 11 when the redundant memory cell 12 is not selected.

At this time the word lines WL0 and DWL0 and the cell plate electrodes CP0 and DCP0 are each turned to "H", thereby charge is read from the ferroelectric capacitor C701 to the bit line BL0, and charge is read from the ferroelectric capacitor DC702 to the bit line /BL0.

Then a potential difference which is decided by an amount of charge and a capacitance between the bit lines is amplified by the sense amplifier SA0, thus the information data is output from the bit line BL0.

In this embodiment, a redundant address is read out and is held in the first latch circuit of the redundant memory cell selecting circuit 16. Then the information data is read either from the main memory cell 11 or from the redundant memory cell 12. This procedure corresponds to the operation as explained in the fifth embodiment referring to FIG. 10.

On the other hand, it is possible to simultaneously read the redundant address and hold it in the first latch circuits of the redundant memory cell selecting circuit 16 while at the same time reading information data from the main memory cell 11 or from the redundant memory cell 12. This corresponds to the operation as explained in FIG. 11. In this case, however, immediately after the source voltage is applied a redundant address which as been read from the redundant address data cell 17 is not stored in the first latch circuit of the redundant memory cell selecting circuit 16. Therefore this holding procedure is necessary beforehand.

The following methods are available for holding redundant address data in the first latch circuits:

In ordinary semiconductor memory devices such as DRAMs, immediately after a voltage source is applied, read and write operations are repeated several times in what is called a dummy cycle. During the period of the dummy cycle, a redundant address can be read and stored in the latch circuits of the redundant memory cell selecting circuit. The dummy cycle is accomplished by repeating step (I) of FIG. 20 several times.

An alternative storage method is to detect application of the voltage source immediately after voltage source is applied and thereafter to repeat the operation of the step (I) several times. In this manner, in the period of the dummy cycle or immediately after the voltage source is applied, a signal for selection or non-selection of the redundant memory cells can be held in the first latch circuit of the redundant memory cell selecting circuit, thereby this signal is held in the first latch circuit during the period of main cycle.

Of course, it should be understood, that a wide range of changes and modifications can be made to the preferred embodiments described above. It is therefore intended that the foregoing detailed description can be regarded as illustrative rather than limiting and that it be understood that it is the following claims, including all equivalents, which are intended to define the scope of the invention.

What is claimed is:

1. A semiconductor memory device comprising:

a main memory cell;

a redundant memory cell;

a redundant address data cell comprising a semiconductor memory can be rewritten many times which stores an address of a part of said main memory cell to be replaced by said redundant memory cell;

a control circuit; and a redundant memory cell selecting circuit having as inputs a first address data from said redundant address data cell and a second address data from said control circuit, wherein said redundant memory cell selecting circuit holds said first address data which has been read from said redundant address data cell, compares said first address data with said second address data for a reading or writing operation which is input via said control circuit, and selects said main memory cell or said redundant memory cell for performing said reading or writing operation.

2. A semiconductor memory device as set forth in claim 1, wherein said redundant memory cell selecting circuit comprises a plurality of first latch circuits for holding said first address data which has been read from said redundant address data cell.

3. A semiconductor memory device as set forth in claim 1, further comprising a control signal generating circuit for generating a control signal to drive said redundant address data cell wherein said redundant address data cell operates only when said control signal is input thereto.

4. A semiconductor memory device as set forth in claim 3, wherein said control signal generating circuit comprises a voltage source application detecting circuit for detecting application of a voltage source and thereafter generating a driving signal.

5. A semiconductor memory device as set forth in claim 1, wherein two or more cell out of said main memory cell, said redundant memory cell and said redundant address data cell are contained in a common memory domain, and the domains occupied by each of said memory cells and data cell are variable.

6. A method of operating a semiconductor memory device containing a redundant memory cell for replacing a failed portion of a main memory cell, comprising the steps of:

applying a source voltage to a redundant memory cell selecting circuit;

storing a plurality of first data addresses in a redundant address data cell, said first addresses representing addresses in said redundant memory cell replacing the failed portion of said main memory cell;

reading said first data addresses in the presence of a control signal coming from a control circuit for controlling said semiconductor memory device;

storing said first addresses data read from said redundant address data cell in said redundant memory cell selecting circuit comprising a plurality of first latch circuits;

comparing a second address data of a read/write operation, which is input via said control circuit, with said first address data in said redundant memory cell selecting circuit; and selecting or not selecting said redundant memory cell for the read/write operation based on said comparison of said first and second address data wherein said reading step and said step of storing said first addresses data read from said redundant address data cell are performed upon application of a source voltage and before a first readout operation of information data.

7. A method of operating a semiconductor memory device containing a redundant memory cell for replacing a failed portion of a main memory cell, comprising the steps of:

applying a source voltage to a redundant memory cell selecting circuit;

storing a plurality of first data addresses in a redundant address data cell, said first addresses representing addresses in said redundant memory cell replacing the failed portion of said main memory cell;

reading said first data addresses in the presence of a control signal coming from a control circuit for controlling said semiconductor memory device;

storing said first addresses data read from said redundant address data cell in said redundant memory cell selecting circuit comprising a plurality of first latch circuits;

comparing a second address data of a read/write operation, which is input via said control circuit, with said first address data in said redundant memory cell selecting circuit; and selecting or not selecting said redundant memory cell for the read/write operation based on said comparison of said first and second address data, wherein said reading step and said step of storing said first addresses data read from said redundant address data cell are performed upon application of a source voltage and before a first operation of a dummy cycle.

8. A semiconductor memory device comprising:
a main memory cell;
a redundant memory cell;

a redundant address data cell comprising a semiconductor memory which stores an address of a part of said main memory cell to be replaced by said redundant memory cell;

a control circuit;

a redundant memory cell selecting circuit having as inputs a first address data from said redundant address data cell and a second address data from said control circuit, wherein said redundant memory cell selecting circuit holds said first address data which has been read from said redundant address data cell, compares said first address data with said second address data for a reading or writing operation which is input via said control circuit, and selects said main memory cell or said redundant memory cell for performing said reading or writing operation; and a flag data memory which stores a flag data indicating that said first address data has been read from said redundant address data cell.

9. A semiconductor memory device as set forth in claim 8, further comprising a voltage detecting circuit for detecting a decrease of voltage when a voltage source is cut off, and wherein said flag data memory comprises a plurality of latch circuits, which are reset with a signal coming from said voltage detecting circuit.

10. A semiconductor memory device as set forth in claim 8, further comprising a reset signal generating circuit, and said flag data memory comprises a plurality of latch circuits which are reset with a signal coming from said reset signal generating circuit.

11. A semiconductor memory device as set forth in claim 8, wherein two or more cells out of said main memory cell, said redundant memory cell, said redundant address data cell and said flag data memory are contained in a common memory domain, and the domains occupied by each of said memory cells, said data cell and said memory are variable.

12. A method of operating a semiconductor memory device containing a redundant memory cell for replacing a failed portion of a main memory cell, comprising the steps of:

applying a source voltage to a redundant memory cell selecting circuit;

storing a plurality of first data addresses in a redundant address data cell, said first addresses representing addresses in said redundant memory cell replacing the failed portion of said main memory cell;

reading said first data addresses in the presence of a control signal coming from a control circuit for controlling said semiconductor memory device;

storing said first addresses data read from said redundant address data cell in said redundant memory cell selecting circuit comprising a plurality of first latch circuits;

comparing a second address data of a read/write operation, which is input via said control circuit, with said first address data in said redundant memory cell selecting circuit;

selecting or not selecting said redundant memory cell for the read/write operation based on said comparison of said first and second address data;

storing a flag data indicating that said first address data has been read from said redundant address data; and determining whether said flag data is set, and if said flag data is set judging an information data to be valid, and if said flag data is not set judging said information data to be invalid and setting said flag data.

13. A method of operating a semiconductor memory device containing a redundant memory cell for replacing a failed portion of a main memory cell, comprising the steps of:

applying a source voltage to a redundant memory cell selecting circuit;

storing a plurality of first data addresses in a redundant address data cell, said first addresses representing addresses in said redundant memory cell replacing the failed portion of said main memory cell;

reading said first data addresses in the presence of a control signal coming from a control circuit for controlling said semiconductor memory device;

storing said first addresses data read from said redundant address data cell in said redundant memory cell selecting circuit comprising a plurality of first latch circuits;

comparing a second address data of a read/write operation, which is input via said control circuit, with said first address data in said redundant memory cell selecting circuit;

selecting or not selecting said redundant memory cell for the read/write operation based on said comparison of said first and second address data;

storing a flag data indicating that said first address data has been read from said redundant address data; and determining whether said flag data is set, and if said flag data is not set a first address data is read out from said redundant address data cell and after said flag data is turned to be set, an information data is read.

14. A method of operating a semiconductor memory device comprising:

a main memory cell;

a redundant memory cell;

a redundant address data cell comprising a semiconductor memory which stores an address of a part of said main memory cell to be replaced by said redundant memory cell;

a control circuit;

a redundant memory cell selecting circuit having as inputs a first address data from said redundant address data cell and a second address data from said control circuit, wherein said redundant memory cell selecting circuit holds said first address data which has been read from said redundant address data cell, compares said first address data with said second address data for reading or writing operation which is input via said control circuit, and selects said main memory cell or said redundant memory cell for performing said reading or writing operation; and a flag data memory which stores a flag data indicating that said first address data has been read from said redundant address data cell, comprising the steps of:

reading said flag data from said flag data memory;

reading said first address data from said redundant address data cell;

reading information data from said main memory cell; and determining whether said flag data is set or not, and if said flag data is set judging said information data to be valid, and if said flag data is not set judging said information data to be invalid and setting said fag data.

15. A method of operating a semiconductor memory device comprising:

a main memory cell;

a redundant memory cell;

a redundant address data cell comprising a semiconductor memory which stores an address of a part of said main memory cell to be replaced by said redundant memory cell;

a control circuit;

a redundant memory cell selecting circuit having as inputs a first address data from said redundant address data cell and a second address data from said control circuit, wherein said redundant memory cell selecting circuit holds said first address data which has been read from said redundant address data cell, compares said first address data with said second address data for reading or writing operation which is input via said control circuit, and selects said main memory cell or said redundant memory cell for performing said reading or writing operation;

and a flag data memory which stores a flag data indicating that said first address data has been read from said redundant address data cell, comprising the steps of:

reading said flag data from said flag data memory; and determining whether said flag data is set or not, and if said flag data is set reading said information data, and if said flag data is not set reading said first address data from said redundant address data cell and reading said information data after setting said flag data.

* * * * *

UNITED STATES PATENT AND TRADEMARK OFFICE
CERTIFICATE OF CORRECTION

PATENT NO. : 5,523,974   Page 1 of 12
DATED : June 4, 1996
INVENTOR(S) : Hiroshige Hirano et al.

It is certified that error appears in the above-identified patent and that said Letters Patent is hereby corrected as shown below: Drawings:

SHEET 8 of 19:  FIG. 11 should read FIG. 8.

SHEET 9 of 19:  FIG. 13 should read FIG. 9.

SHEET 10 of 19:  FIG. 15 should read FIG. 10.

SHEET 11 of 19:  FIG. 16 should read FIG. 11.

SHEET 12 of 19:  FIG. 18 should read FIGS. 12 and 13.

SHEET 13 of 19:  FIG. 19 should read FIGS. 14 and 15.

SHEET 14 of 19:  FIG. 20 should read FIG. 16.

Figure 21:
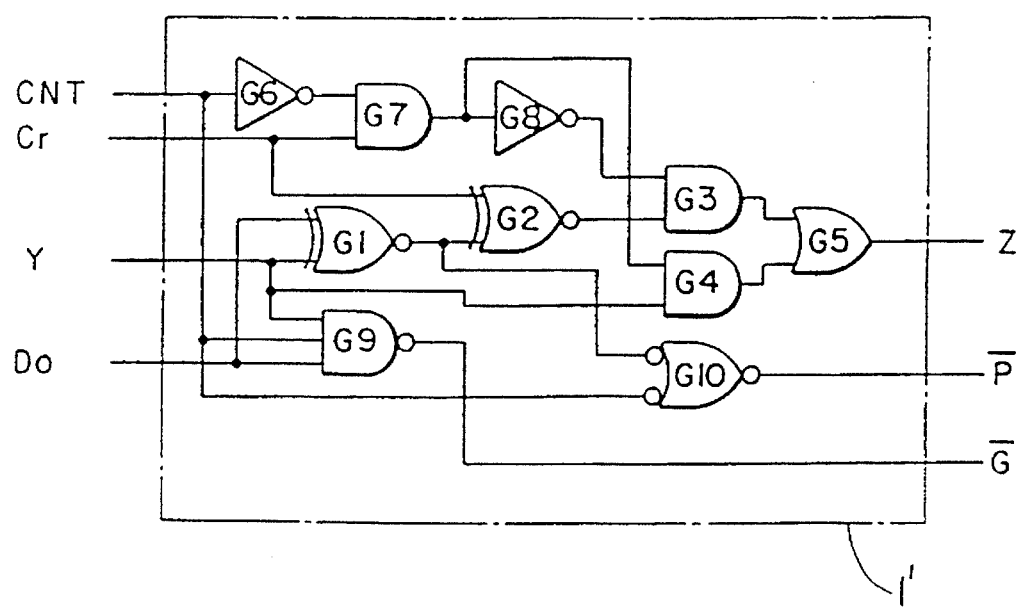
FIG. 21 is the circuit block diagram of a prior art semiconductor memory device.
Figure 18:
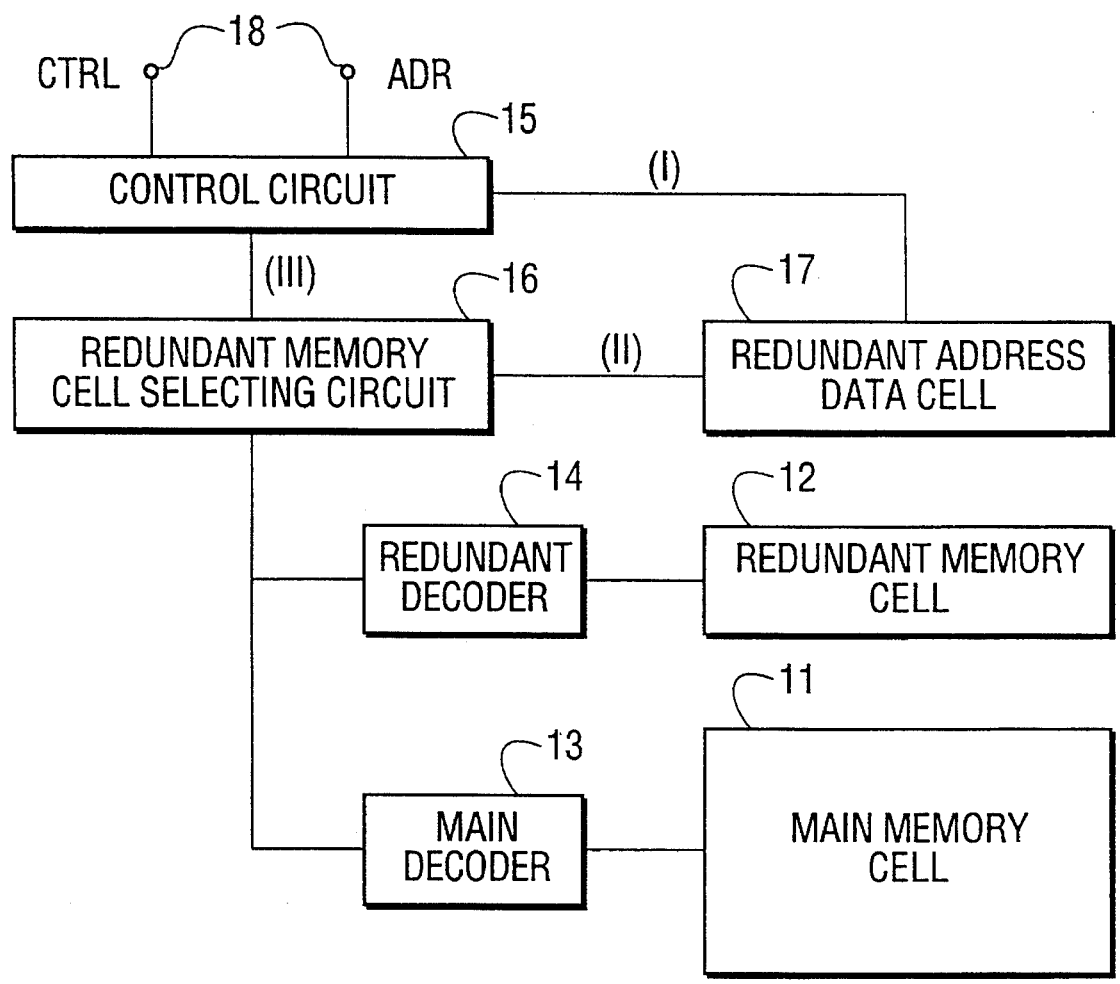

SHEET 15 of 19:  FIG. 21 should read FIG. 17.

Figure 23A:
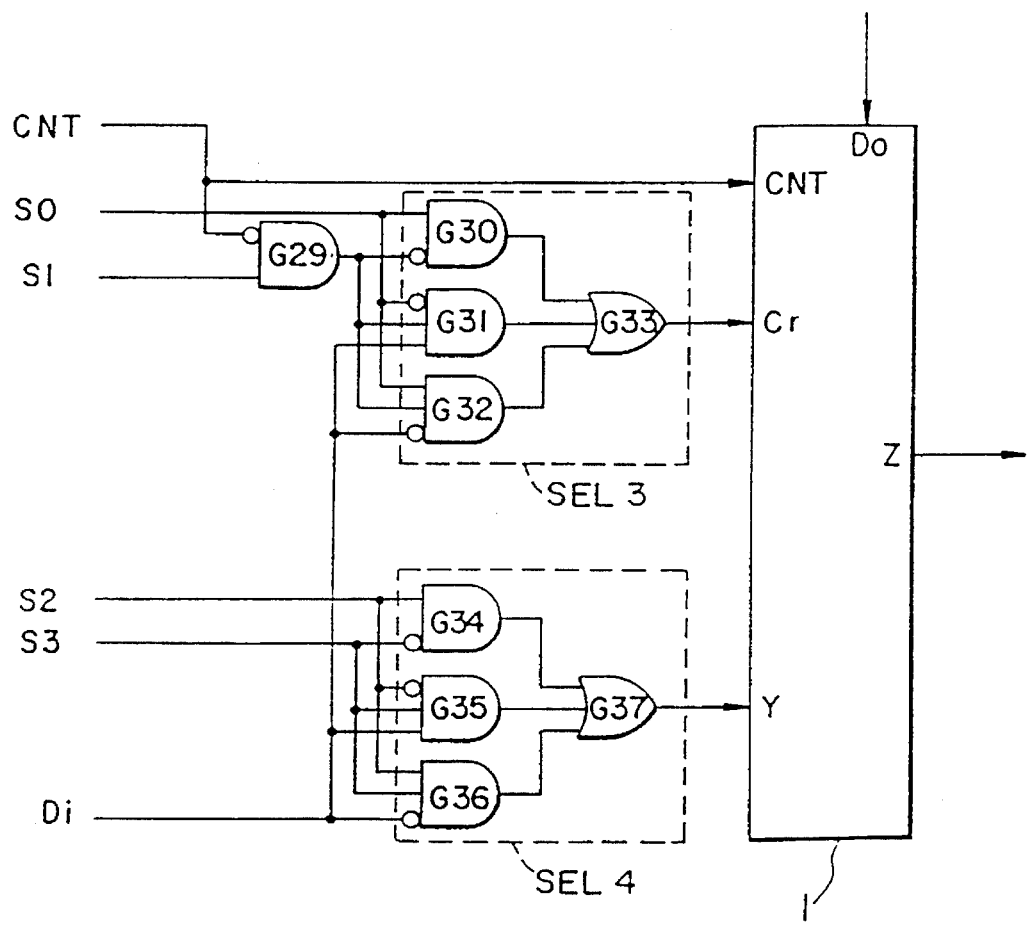

SHEET 17 of 19:  FIG. 23a should read FIG. 19.

SHEET 18 of 19:  FIG. 23b should read FIG. 20.

Figure 23C:
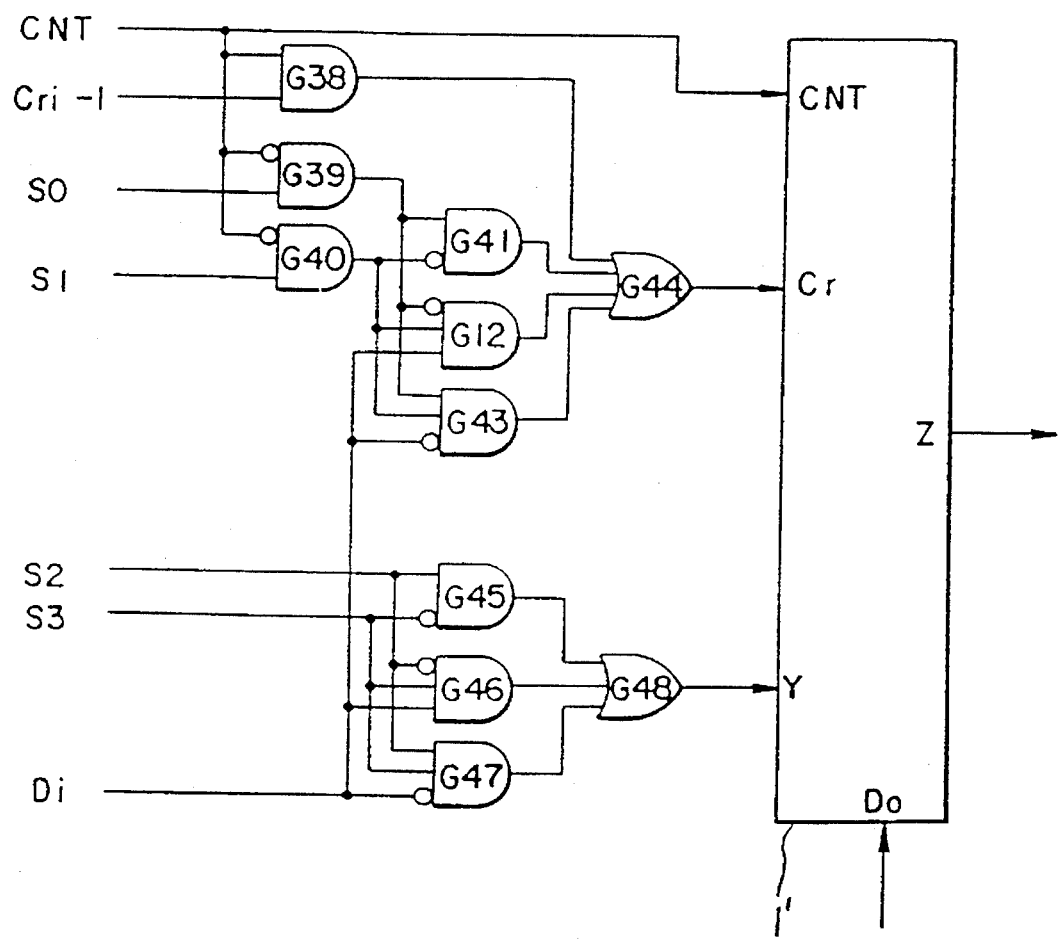

SHEET 19 of 19:  FIG. 23c should read FIG. 21.

Signed and Sealed this

Twenty-sixth Day of November 1996

*Attest:*

BRUCE LEHMAN

*Attesting Officer*   *Commissioner of Patents and Trademarks*

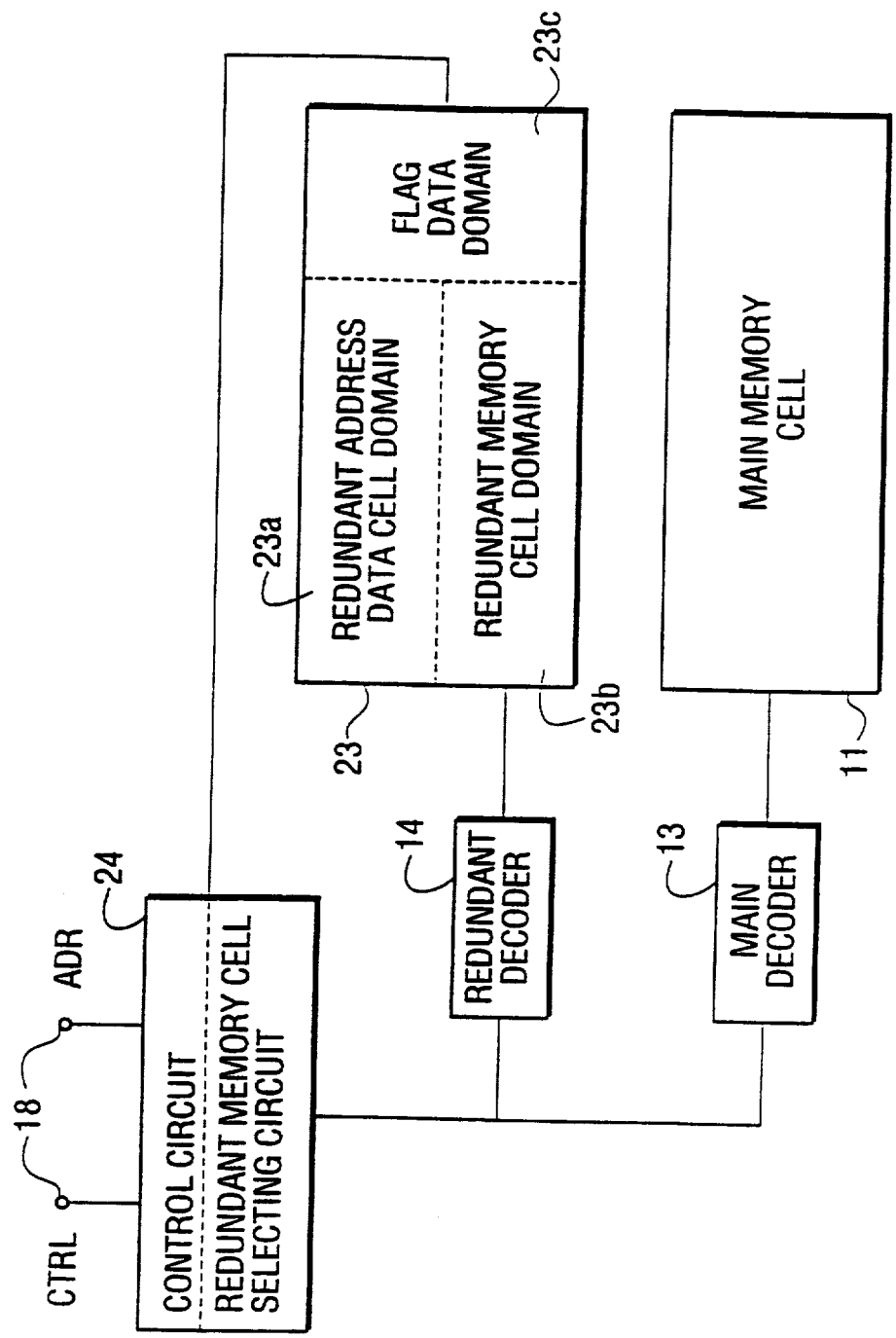

FIG. 17

| REDUNDANT ADDRESS | DATA DOMAIN | | FLAG DOMAIN ADDRESS/DATA | USE/NON-USE | OK/NG |
|---|---|---|---|---|---|
| 0 | EXTERNAL ADDRESS 0 | USED REDUNDANT ADDRESS 5 | 1 | 1 | 1 |
| 1 | EXTERNAL ADDRESS 1 | USED REDUNDANT ADDRESS 7 | 1 | 1 | 1 |
| 2 | — | | — | 0 | 0 |
| 3 | EXTERNAL ADDRESS 2 | USED REDUNDANT ADDRESS 8 | 1 | 1 | 1 |
| 4 | EXTERNAL ADDRESS 3 | USED REDUNDANT ADDRESS 9 | 1 | 1 | 1 |
| 5 | DATA (EXTERNAL ADDRESS 0) | | 0 | 1 | 1 |
| 6 | — | | — | 0 | 0 |
| 7 | DATA (EXTERNAL ADDRESS 1) | | 0 | 1 | 1 |
| 8 | DATA (EXTERNAL ADDRESS 2) | | 0 | 1 | 1 |
| 9 | DATA (EXTERNAL ADDRESS 3) | | 0 | 1 | 1 |
| 10 | NOT USED | | 0 | 0 | 1 |
| 11 | — | | — | 0 | 0 |
| 12 | NOT USED | | 0 | 0 | 1 |
| 13 | NOT USED | | 0 | 0 | 1 |
| 14 | NOT USED | | 0 | 0 | 1 |
| 15 | NOT USED | | 0 | 0 | 1 |